United States Patent
Sekikawa

(10) Patent No.: US 10,141,363 B2
(45) Date of Patent: Nov. 27, 2018

(54) SEMICONDUCTOR DEVICE AND METHOD FOR MANUFACTURING SAME

(71) Applicant: Renesas Electronics Corporation, Koutou-ku, Tokyo (JP)

(72) Inventor: Hiroaki Sekikawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/488,498

(22) Filed: Apr. 16, 2017

(65) Prior Publication Data

US 2018/0006068 A1  Jan. 4, 2018

(30) Foreign Application Priority Data

Jun. 29, 2016 (JP) ................................ 2016-128548

(51) Int. Cl.
| | | |
|---|---|---|
| H01L 21/00 | (2006.01) | |
| H01L 21/339 | (2006.01) | |
| H01L 27/146 | (2006.01) | |

(52) U.S. Cl.
CPC ...... *H01L 27/1464* (2013.01); *H01L 27/1463* (2013.01); *H01L 27/14621* (2013.01); *H01L 27/14623* (2013.01); *H01L 27/14627* (2013.01); *H01L 27/14632* (2013.01); *H01L 27/14636* (2013.01); *H01L 27/14687* (2013.01)

(58) Field of Classification Search
CPC ........... H01L 27/1464; H01L 27/14687; H01L 27/14623; H01L 27/14627; H01L 27/14621; H01L 27/14632; H01L 27/14636; H01L 27/1463

See application file for complete search history.

(56) References Cited

U.S. PATENT DOCUMENTS

| | | |
|---|---|---|
| 6,603,162 B1 | 8/2003 | Uchiyama et al. |
| 7,294,873 B2 | 11/2007 | Suzuki et al. |
| 8,710,612 B2 | 4/2014 | Tsai et al. |
| 9,312,295 B2* | 4/2016 | Terada ................ H01L 27/1464 |
| 9,356,059 B2 | 5/2016 | JangJian et al. |
| 2010/0230773 A1* | 9/2010 | Nakazawa ........ H01L 27/14632 257/459 |

FOREIGN PATENT DOCUMENTS

| | | |
|---|---|---|
| JP | H10-012570 A | 1/1998 |
| JP | 2003-031785 A | 1/2003 |
| JP | 2006-140506 A | 6/2006 |
| JP | 2012-244174 A | 12/2012 |
| JP | 2015-159338 A | 9/2015 |

* cited by examiner

*Primary Examiner* — Su C Kim
(74) *Attorney, Agent, or Firm* — Shapiro, Gabor and Rosenberger, PLLC

(57) ABSTRACT

When a trench that penetrates a semiconductor substrate in a scribe region in a solid-state imaging element of a back side illumination type, occurrence of contamination of the solid-state imaging element caused by an etching step for foaming the trench or a dicing step for singulating a semiconductor chip is prevented. When a silicide layer that covers a surface and the like of an electrode of a transistor is formed, in order to prevent formation of the silicide layer that covers a main surface of the semiconductor substrate in the scribe region, the main surface of the semiconductor substrate is covered with an insulation film before a forming step for the silicide layer.

10 Claims, 26 Drawing Sheets

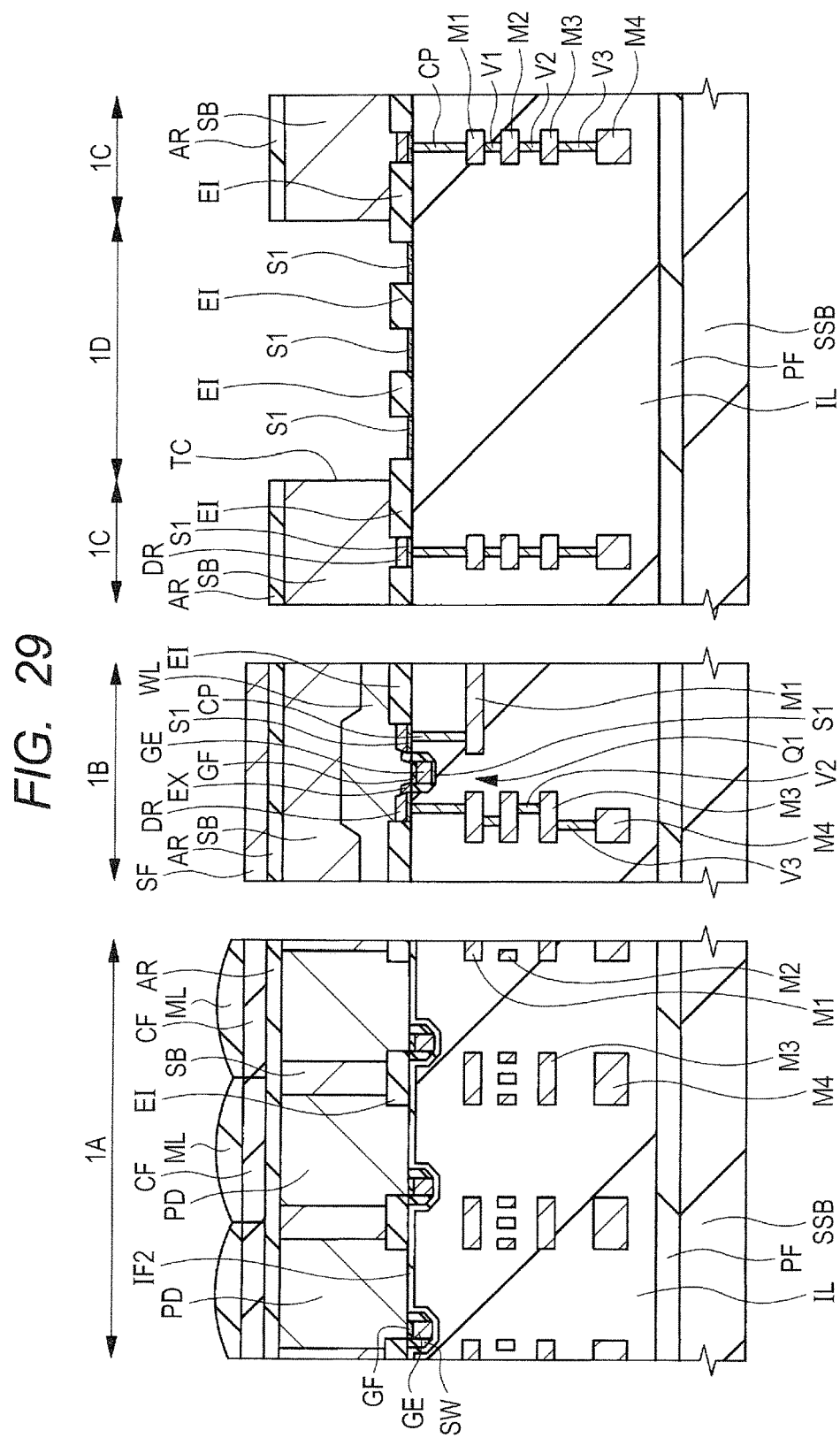

SEMICONDUCTOR DEVICE AND METHOD FOR MANUFACTURING SAME

CROSS-REFERENCE TO RELATED APPLICATIONS

The disclosure of Japanese Patent Application No. 2016-128548 filed on Jun. 29, 2016 including the specification, drawings and abstract is incorporated herein by reference in its entirety.

BACKGROUND

The present invention relates to a semiconductor device and a method for manufacturing the same, and relates specifically to a technology that is effective in being applied to a semiconductor device including a solid-state imaging element.

As a solid-state imaging element (image element) used for a digital camera and the like, it is known to arrange a photodiode which is a light receiving element over a main surface of a semiconductor substrate. As a method for obtaining plural solid-state imaging elements from a semiconductor wafer (semiconductor substrate), there is a method of cutting a scribe region (scribe line) that exists in a lattice shape in the main surface of the semiconductor wafer.

In Japanese Unexamined Patent Application Publication No. 2003-031785 (Patent Document 1), a solid-state imaging element is described which has a pixel structure of a back side light receiving type.

In Japanese Unexamined Patent Application Publication No. 2015-159338 (Patent Document 2), it is described that, in a solid-state imaging element of a back side illumination (BSI) type, a dielectric layer, a polysilicon layer, a silicon oxide layer, and a substrate formed in the scribe line are removed by etching.

In Japanese Unexamined Patent Application Publication No. 2012-244174 (Patent Document 3), it is described that, in an image sensor of the back side illumination type, a substrate of the bonding region, a buffer layer, and a separation layer are removed by etching, and a metal layer section is exposed.

In Japanese Unexamined Patent Application Publication No. 2006-140506 (Patent Document 4), it is described that, in a flattening step by polishing, dishing or waviness occur on the surface of the polishing object. Also, it is described that, in order to prevent occurrence of the dishing and the like, a dummy pattern is formed over the semiconductor substrate of the scribe region.

In Japanese Unexamined Patent Application Publication No. Hei 10 (1998)-012570 (Patent Document 5), it is described that, as a technology for forming an electrode of low resistance, a silicide layer covering the upper surface of the substrate is formed.

SUMMARY

When a silicide layer is formed over the main surface of the semiconductor wafer at the surface of an electrode with the aim of reducing the resistance of an electrode and the like of a transistor formed in the vicinity, it is possible that a silicide layer is formed in the scribe region also. In this case, when the semiconductor substrate of the scribe region is removed by etching, the silicide layer of the scribe region is subjected to etching scatters which becomes a cause of deterioration of the characteristics in the solid-state imaging element.

Other objects and new features will be clarified from the description of the present specification and the attached drawings.

Followings are brief descriptions of the summary of the representative one among the embodiments disclosed in the present application.

According to a method for manufacturing a semiconductor device which is an embodiment, in a step for forming a solid-state imaging element of the back side illumination type, an insulation film that covers the main surface of the semiconductor substrate of the scribe region is formed before forming the silicide layer that covers the transistor and the like.

Also, according to a semiconductor device which is another embodiment, at an end section of the singulated solid-state imaging element of the back side illumination type, a silicide layer is not formed in the region exposed from the semiconductor substrate.

According to an embodiment disclosed in the present application, reliability of the semiconductor device can be improved. Particularly, occurrence of the defect caused by etching of the silicide layer in the imaging element can be prevented.

BRIEF DESCRIPTION OF THE DRAWINGS

FIG. 29 is a cross-sectional view that explains a manufacturing step for a semiconductor device which is a comparative example.

DETAILED DESCRIPTION

Below, embodiments of the present invention will be explained in detail based on the drawings. Also, in all drawings for explaining the embodiment, members having a same function are marked with a same reference sign, and repeated explanation for them will be omitted. Further, in the embodiments described below, explanation of a same or similar portion will not be repeated in principle unless it is particularly necessary.

First Embodiment

Figure 1:
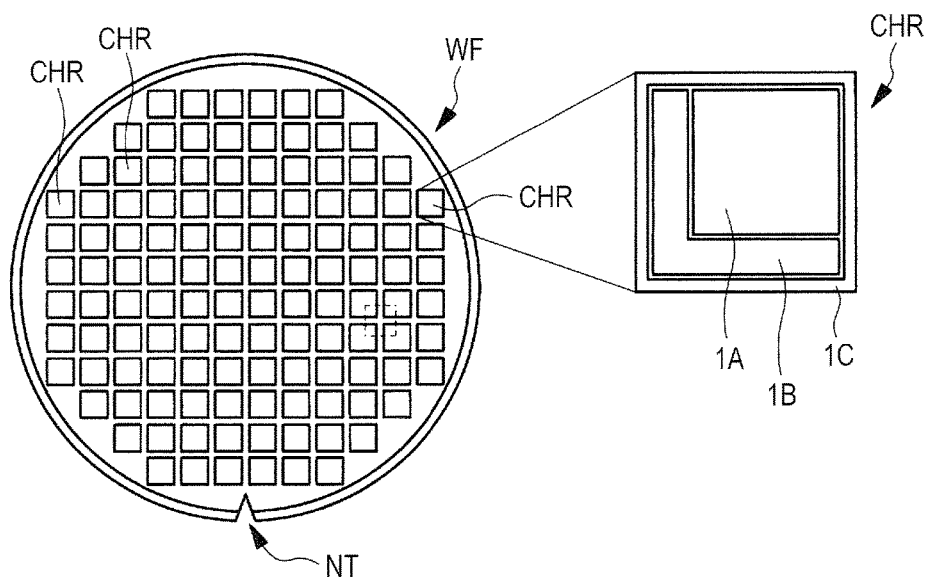
FIG. 1 is a plan view that explains a manufacturing step for a semiconductor device which is the first embodiment of the present invention.
Figure 2:
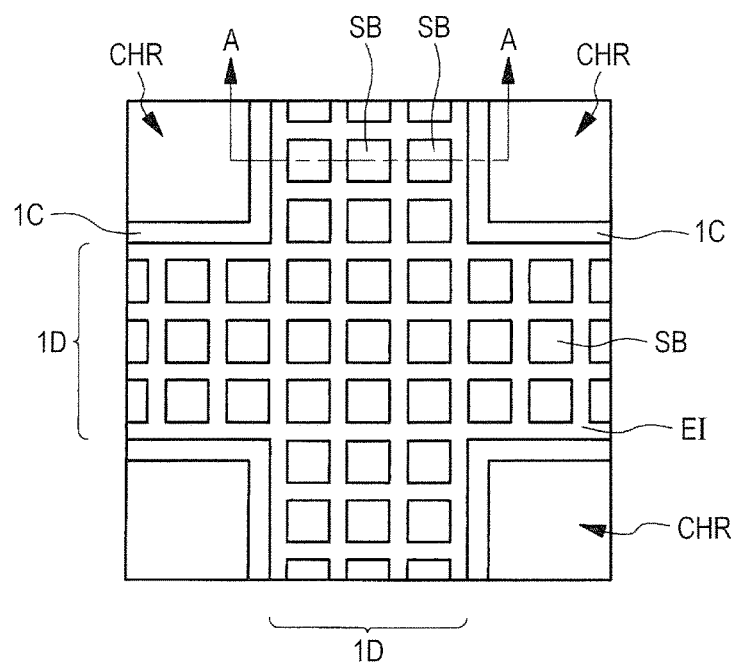
FIG. 2 is a plan view that enlargingly shows a part of FIG. 1.

Below, a method for manufacturing a semiconductor device of the present embodiment and a structure of the semiconductor device will be explained using FIG. 1 to FIG. 15. FIG. 1, FIG. 2, and FIG. 14 are plan views that explain a manufacturing step for the semiconductor device of the present embodiment. FIG. 3 to FIG. 13, and FIG. 15 are cross-sectional views that explain a manufacturing step for the semiconductor device of the present embodiment. In each drawing of FIG. 3 to FIG. 13, and FIG. 15, a pixel region 1A, a peripheral circuit region 1B, a seal ring region 1C, a scribe region (scribe line) 1D, and a seal ring region 1C are shown in this order from the left side. Although the pixel region 1A, the peripheral circuit region 1B, and the region that includes the seal ring regions 1C and the scribe regions 1D are respectively shown so as to be separate from each other in these cross-sectional views, these regions actually exist over a same substrate side by side.

Figure 3:
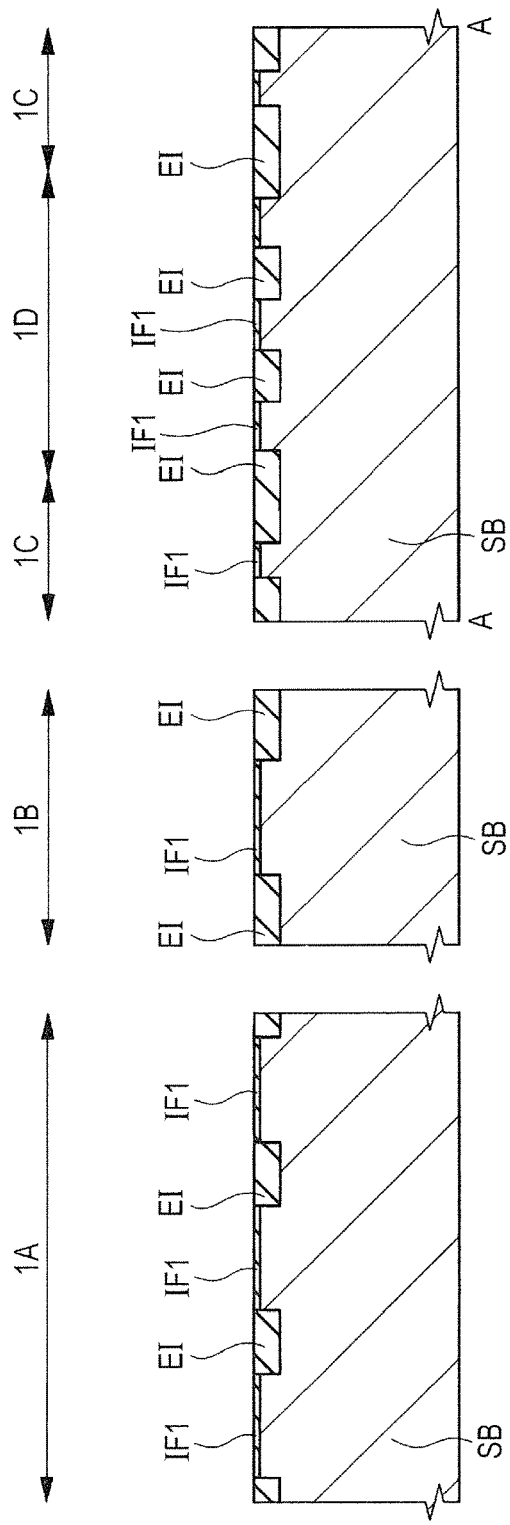
FIG. 3 is a cross-sectional view that includes a cross section taken along the line A-A of FIG. 2.

In the manufacturing step for the semiconductor device, first, a semiconductor substrate (semiconductor wafer) SB of N-type including a mono-crystal silicon (Si) for example is provided as shown in FIG. 1 to FIG. 3. The semiconductor substrate SB includes a main surface that is the first surface on a side where a semiconductor element such as a photodiode and a transistor is formed in a later step, and a rear surface (back surface) that is the second surface on the opposite side of the main surface. Here, until the semiconductor substrate SB is reversed vertically in a step that is explained below using FIG. 11, the direction of the main surface side with respect to the rear surface is referred to as the upper direction, and the direction opposite to the upper direction is referred to as the lower direction. Further, after the semiconductor substrate SB is reversed vertically in the step explained below using FIG. 11, the direction of the rear surface side with respect to the main surface is referred to as the upper direction, and the direction opposite to the upper direction is referred to as the lower direction.

Next, an insulation film (silicon oxide film) IF1 (refer to FIG. 3) that is thin with approximately 10 nm thickness is formed over the main surface of the semiconductor substrate SB by a thermal oxidation method for example. Thereafter, a silicon nitride film (not illustrated) with approximately several hundred nm thickness is formed over the insulation film IF1 using a CVD (Chemical Vapor Deposition) method for example. Then the silicon nitride film and the insulation film IF1 are removed using a photolithography technology and an etching method in the region where an element separation region is formed. Thereafter, plural trenches are formed in the upper surface (main surface) of the semiconductor substrate SB by executing dry etching. The depth of the trench is 300 nm for example. The depth of the trench mentioned here means the distance from the main surface to the bottom surface of the trench in the direction perpendicular to the main surface of the semiconductor substrate SB.

Next, after the photoresist film is removed, each of the plural trenches is filled with an insulation film using the CVD method for example. The insulation film is formed of a TEOS (Tetra Ethyl Ortho Silicate) film, that is, a silicon oxide film for example, and its film thickness is equal to or more than 300 nm.

Next, the upper surface of the insulation film is polished using a CMP (Chemical Mechanical Polishing) method, the upper surface is thereby flattened, and the upper surface of the silicon nitride film described above is exposed. Thereafter, by executing wet etching and the like using fluoric acid for example, the height of the insulating film (separation oxide film) embedded in each of the plural trenches is adjusted properly. Thereafter, by executing wet etching using hot phosphoric acid and the like, the silicon nitride film is removed, and the upper surface of the insulation film IF1 is exposed.

Thus, plural element separation regions (separation insulating films) EI formed of insulation films (silicon oxide films) embedded within the trenches of the semiconductor substrate SB are formed. The region where the upper surface of the semiconductor substrate SB is exposed from the element separation region EI is an active region, and is defined (partitioned) by the element separation regions EI. Although formation of the element separation region EI by an STI (Shallow Trench Isolation) method was explained here, the element separation region EI can be formed also by a LOCOS (Local Oxidation of Silicon) method and the like. The film thickness of the element separation region EI is 300 nm for example.

Here, as shown in FIG. 1, a semiconductor wafer WF (semiconductor substrate SB) having a circular shape in plan view includes a notch NT at a part of the end section in plan view. Also, at the main surface of the semiconductor wafer WF, plural chip regions CHR that line up in an array shape exist. In FIG. 1, one of plural chip regions CHR is enlargingly shown separately from the semiconductor wafer WF. In plan view, each chip region CHR has a rectangular shape, and includes the pixel region 1A, the peripheral circuit region 1B, and the seal ring region 1C.

In plan view, the pixel region 1A and the peripheral circuit region 1B of each chip region CHR are positioned inside the annular seal ring region 1C. The pixel region 1A is a region (pixel array region) including plural pixels which are light receiving sections for receiving irradiated light and obtaining an electric charge signal by photoelectric conversion. The peripheral circuit region 1B is a region including a circuit that processes the signal obtained in the pixel region 1A by imaging, and includes a pixel reading circuit, an output circuit, a row selecting circuit, a control circuit, and the like for example. In other words, the peripheral circuit region 1B includes an A/D conversion circuit for converting an analog signal to a digital signal, a signal processing circuit, and the like.

The seal ring region 1C is a region that disposes metal wiring and the like, the metal wiring being for preventing occurrence of a crack inside the seal ring region 1C when the semiconductor wafer is cut by a dicing blade in a later step. Therefore, the seal ring region 1C is formed at an end section of the chip region CHR.

The chip regions CHR are disposed so as to be arrayed by plural numbers in the first direction and the second direction along the upper surface of the semiconductor wafer WF. The first direction and the second direction are at right angles to each other. The chip regions CHR arrayed in a matrix shape over the upper surface of the semiconductor wafer WF are apart from each other. The region between neighboring chip regions CHR is the scribe region 1D. In other words, the scribe region 1D is a region that is positioned on the opposite side of the peripheral circuit region 1B with the boundary of the seal ring region 1C. That is to say, each chip region CHR is surrounded by the scribe region 1D.

Also, the scribe region 1D extends in the first direction or the second direction. The scribe region 1D is a region where a part of it is cut along the extending direction of the scribe region 1D in a later step. In other words, the scribe region 1D is a region where a part of the scribe region 1D is removed for separating respective chip regions CHR from each other. Each chip region CHR that has been singulated by the cutting becomes a solid-state imaging element. The width in the transverse direction of the scribe region 1D that extends in one direction is approximately 100 μm for example.

In FIG. 2, a position where the scribe region 1D extending in the first direction and the scribe region 1D extending in the second direction cross each other is enlargingly shown. FIG. 2 is a plan view that enlargingly shows a region surrounded by the broken lines of FIG. 1. In FIG. 2, the insulation films IF1 (refer to FIG. 3) described above are not illustrated. In FIG. 2, the element separation region EI and the upper surface of the semiconductor substrate SB are shown in the scribe region 1D. Further, the upper surface of the semiconductor substrate SB and the element separation region EI are exposed also in the chip region CHR including the seal ring region 1C, and each of them has a predetermined layout. However, in the drawing, the layout of the semiconductor substrate SB and the element separation region EI is not illustrated in the chip region CHR.

As shown in FIG. 2, in the scribe region 1D, the pattern of the upper surface of the semiconductor substrate SB surrounded by the element separation region EI is disposed so as to be arrayed in plural numbers in a matrix shape. In other words, the upper surface of the semiconductor wafer in the scribe region 1D is covered with the element separation region EI excepting the position where the pattern is formed. The pattern that is the upper surface of the semiconductor substrate SB has a rectangular shape in plan view. The element separation region EI is formed into a lattice shape in the scribe region 1D.

Although it may be possible not to form such pattern and to cover the entirety scribe region 1D by the element separation region EI, in this case, because the region where only the element separation region EI is formed is too wide, the upper surface of the element separation region EI is cut excessively in the polishing step described above that is executed in forming the element separation region EI. That is to say, dishing occurs. In this case, in the scribe region 1D and in the chip region CHR in the vicinity of the scribe region 1D, there is a risk that the height of the film formed over the semiconductor substrate SB becomes non-uniform and defective film formation occurs because of it. Also, there are risks that working defect caused by occurrence of defocusing in exposing the photoresist film, or the short circuit caused by a residual film in the polishing step, and so on occur. These problems occur in the seal ring region 1C in the vicinity of the scribe region 1D, and so on for example.

Therefore, in order to prevent the upper surface of the element separation region EI of the scribe region 1D from being largely recessed compared to the upper surface of the element separation region EI of other regions, that is, dishing in the polishing (CMP) step, here, in plural positions of the scribe region 1D, the element separation region EI is not formed and the upper surface of the semiconductor substrate SB is exposed. Thus, the pattern, that is, the upper surface of the semiconductor substrate SB exposed from the element separation region EI in the scribe region 1D is not an active region where elements and the like are formed but a pseudo element separation region, that is, a dummy pattern of the element separation region. The dummy pattern has a square shape in plan view.

The cross-sectional view including the scribe region 1D and the seal ring region 1C shown on the right side of FIG. 3 shows a cross section taken along the line A-A of FIG. 2.

As shown in FIG. 3, in each of the pixel region 1A, the peripheral circuit region 1B, the seal ring region 1C, and the scribe region 1D, the element separation region EI is formed by plural numbers, and, in the region adjacent to the element separation region EI, the upper surface of the semiconductor substrate SB is exposed.

Figure 4:
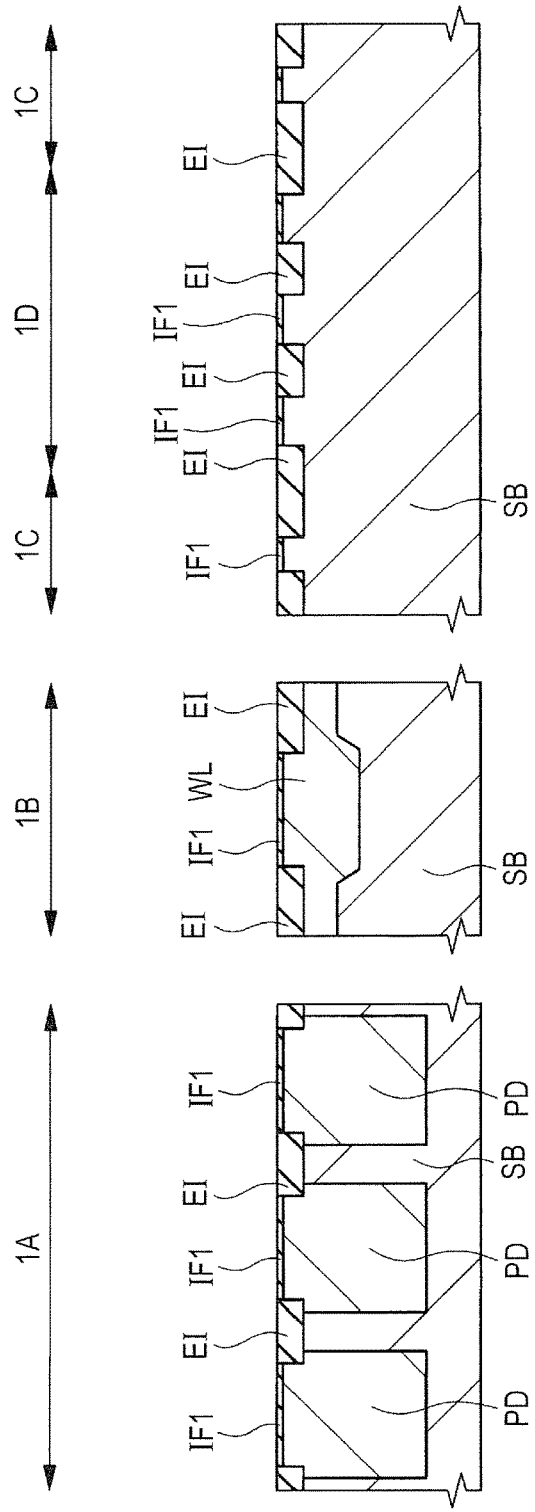
FIG. 4 is a cross-sectional view that explains a manufacturing step for the semiconductor device subsequent to FIG. 3.

Next, as shown in FIG. 4, a P-type well WL is formed over the main surface of the semiconductor substrate SB of the peripheral circuit region 1B using the photolithography technology and the ion implantation method. At this time, although the well may be formed over the upper surface of the semiconductor substrate SB of the pixel region 1A, such well is not illustrated here. In the ion implantation, P-type impurities (B (boron) for example) are implanted. Further, although formation of an N-channel type transistor in the peripheral circuit region 1B will be explained in the present embodiment, a P-channel type transistor is also formed in a region that is in the peripheral circuit region 1B but is not illustrated. At a position where the P-channel type transistor is formed, the conductivity type is made different from the conductivity type of the impurity region that is formed in the semiconductor substrate SB when the N-channel type transistor is formed.

Next, photodiodes PD are formed over the main surface of the semiconductor substrate SB of the pixel region 1A using the photolithography technology and the ion implantation method. The photodiode PD is a light receiving element formed of an N-type semiconductor region that includes N-type impurities (P (phosphorus) or As (arsenic) for example) implanted mainly to the upper surface of the semiconductor substrate SB. Further, the photodiode PD also includes a P-type semiconductor region that is formed over the upper surface of the semiconductor substrate SB or around the N-type semiconductor region. In other words, the photodiode PD is configured of a PN junction of the N-type semiconductor region and the P-type semiconductor region.

In the pixel region 1A, plural photodiodes PD are formed, and each photodiode PD is formed in an active region that is defined by the element separation region EI. Here, each of the regions where plural photodiodes PD are formed becomes one pixel. In other words, one pixel has one photodiode PD.

Figure 5:
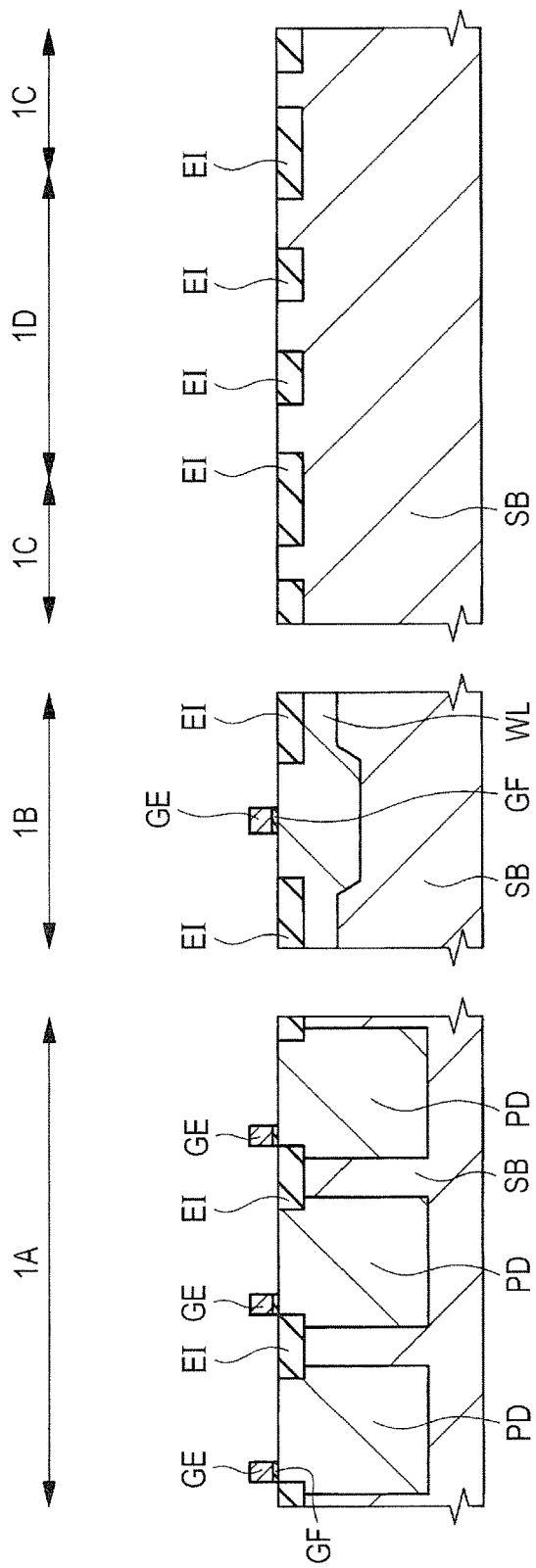
FIG. 5 is a cross-sectional view that explains a manufacturing step for the semiconductor device subsequent to FIG. 4.

Next, as shown in FIG. 5, an insulation film formed of a silicon oxide film is formed over the upper surface of the semiconductor substrate SB using the thermal oxidation method and the like for example after removing the insulation film IF1. Thereafter, a polysilicon film is formed over the upper surface of the semiconductor substrate SB through the insulation film. The polysilicon film can be formed by the CVD method for example. Next, the polysilicon film and the insulation film are worked using the photolithography technology and the etching method. Thus, the upper surface of each of the photodiode PD, the element separation region EI, and the semiconductor substrate SB is exposed from the polysilicon film. By this working, a gate electrode GE formed of the polysilicon film and a gate insulation film GF formed of the insulation film are formed. The film thickness of the gate insulation film GF is 2-10 nm for example.

Here, the gate electrode contains impurities such as P (phosphorus) or B (boron) for example. These impurities may be introduced into the polysilicon film during film formation of the polysilicon film, or may be introduced into the polysilicon film by the ion implantation method and the like after film formation of the polysilicon film. The gate electrode GE is formed in each of the pixel region 1A and the peripheral circuit region 1B by plural numbers, but is not formed in the seal ring region 1C and the scribe region 1D.

Figure 6:
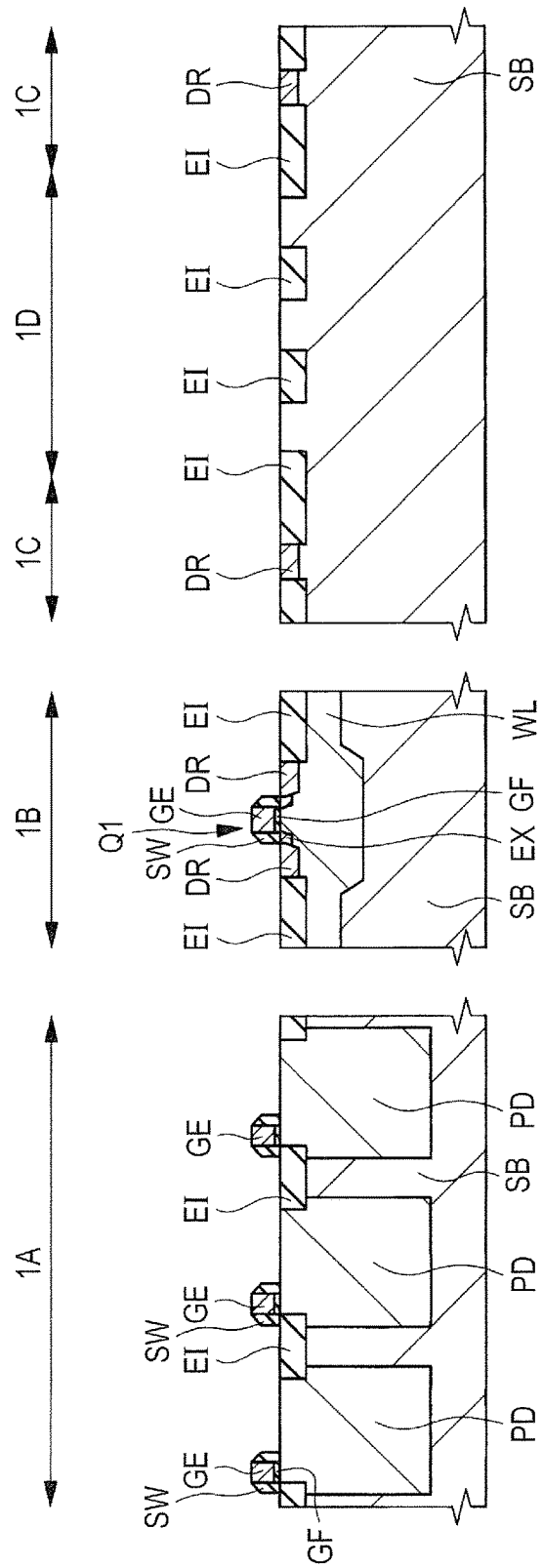
FIG. 6 is a cross-sectional view that explains a manufacturing step for the semiconductor device subsequent to FIG. 5.

Next, as shown in FIG. 6, an extension region (LDD region) EX that is an N-type semiconductor region is formed over the main surface of the semiconductor substrate SB beside the gate electrode GE using the photolithography technology and the ion implantation method. Also, the extension region EX is not formed over the upper surface of the photodiode PD. The extension region EX is formed by executing ion implantation utilizing the photoresist film (not illustrated) and the gate electrode GE as an implantation prevention mask, and implanting N-type impurities (P (phosphorus) or As (arsenic) for example) to the main surface of the semiconductor substrate SB.

Next, side walls SW that cover the lateral walls of each gate electrode GE are formed. Here, after depositing an insulation film covering the gate electrode GE by the CVD method and the like, the insulation film is subjected to dry etching (anisotropic etching), thereby the upper surface of the gate electrode GE and the semiconductor substrate SB is exposed, and thereby the side walls SW are formed, the side walls SW being formed of the insulation film that remains at the side of the gate electrode GE. The side wall SW has a laminated structure including a silicon oxide film and a silicon nitride film for example, the silicon nitride film being formed over the silicon oxide film.

Next, diffusion regions DR that are N-type semiconductor regions are formed over the main surface of the semiconductor substrate SB beside the pattern that is formed of the gate electrode GE and the side walls SW using the photolithography technology and the ion implantation method. Also, the diffusion region DR is not formed over the upper surface of the photodiode PD. The diffusion region DR is formed by implanting N-type impurities (P (phosphorus) or As (arsenic) for example) to the main surface of the semiconductor substrate SB by ion implantation utilizing the gate electrode GE, the photoresist film (not illustrated), and the side walls SW as an implantation prevention mask.

The diffusion region DR has higher impurity concentration compared to the extension region EX. Thus, by forming an LDD (Lightly Doped Drain) structure that includes the diffusion region DR having high impurity concentration and the extension region EX having low impurity concentration, the short channel effect of a transistor Q1 described below can be suppressed. The depth of formation of the extension region EX is shallower than the depth of formation of the diffusion region DR. Also, the extension region EX is formed at a position closer to a region (channel region) right below the gate electrode GE compared to the diffusion region DR that is adjacent to the extension region EX.

By the step described above, a source-drain region including the diffusion region DR and the extension region EX is formed. In other words, a source region is formed in the upper surface of the semiconductor substrate SB in a region adjacent to one lateral wall of the gate electrode GE, and a drain region is formed in the upper surface of the semiconductor substrate SB in a region adjacent to other lateral wall. Here, a set of the source region and the drain region is called a source-drain region. In the peripheral circuit region 1B, the gate electrode GE and the source-drain region that is disposed so as to sandwich the gate electrode GE configure the transistor (field effect transistor) Q1. The transistor Q1 is an N-channel type MISFET (Metal Insulator Semiconductor Field Effect Transistor).

A transistor having such structure is formed as a peripheral transistor (not illustrated) in each pixel of the pixel region 1A also. The peripheral transistor means an amplifier transistor, a reset transistor, and a selection transistor included in each pixel. The peripheral transistor configures a signal scan circuit section. Also, the gate electrode GE shown in the pixel region 1A of FIG. 6, the N-type semiconductor region that configures the photodiode PD, and the drain region (not illustrated) configure a transfer transistor. The transfer transistor includes an N-type semiconductor region that configures the photodiode PD as a source region. Further, the diffusion region DR is also formed in the upper surface of the semiconductor substrate SB that is exposed in the seal ring region 1C.

Also, at a region not illustrated in the peripheral circuit region 1B, a passive element such as a resistive element or a capacitative element is also formed.

Figure 7:
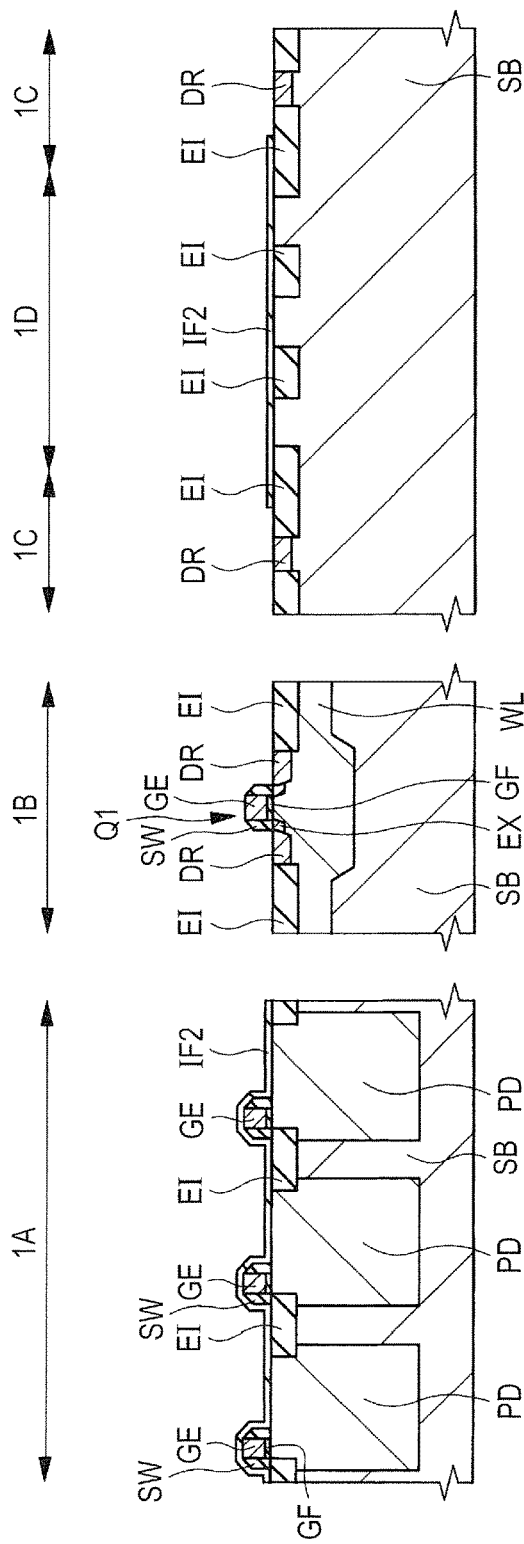
FIG. 7 is a cross-sectional view that explains a manufacturing step for the semiconductor device subsequent to FIG. 6.

Next, as shown in FIG. 7, by forming an insulation film IF2 using a CVD method for example, the upper surfaces of each of the semiconductor substrate SB, the gate electrode GE, and the photodiode PD having been exposed are covered. The insulation film IF2 is formed of a silicon oxide film, a silicon nitride film, or a laminated film of them for example. The film thickness of the insulation film IF2 is several hundred nm for example. Thereafter, the insulation film IF2 of the peripheral circuit region 1B is removed using the photolithography technology and the etching method.

Thus, the upper surface of the photodiode PD is covered with the insulation film IF2 in the pixel region 1A, and the upper surface of the semiconductor substrate SB and the upper surface of the element separation region EI are covered with the insulation film IF2 in the scribe region 1D. In the peripheral circuit region 1B, the gate electrode GE and the source-drain region are exposed from the insulation film IF2. Also, the peripheral transistor of the pixel region 1A is exposed from the insulation film IF2 similarly to the transistor Q1. Although the upper surface of the gate electrode GE of the transfer transistor adjacent to the photodiode PD is covered with the insulation film IF2 in FIG. 7, the upper surface of the gate electrode GE may be exposed from the insulation film IF2. The insulation film IF2 is a protection film for preventing the upper surface of the semiconductor substrate SB from becoming silicide in a later step, that is, a silicide protection film. The insulation film IF2 also covers the surface of the resistive element for example in a region not illustrated.

The insulation film IF2 formed in the scribe region 1D is a film of a same layer as the insulation film IF2 formed in the pixel region 1A. The film of a same layer mentioned here means a film that is formed of one film formed simultaneously in the film formation step and is separated from each other in a working step thereafter.

Figure 8:
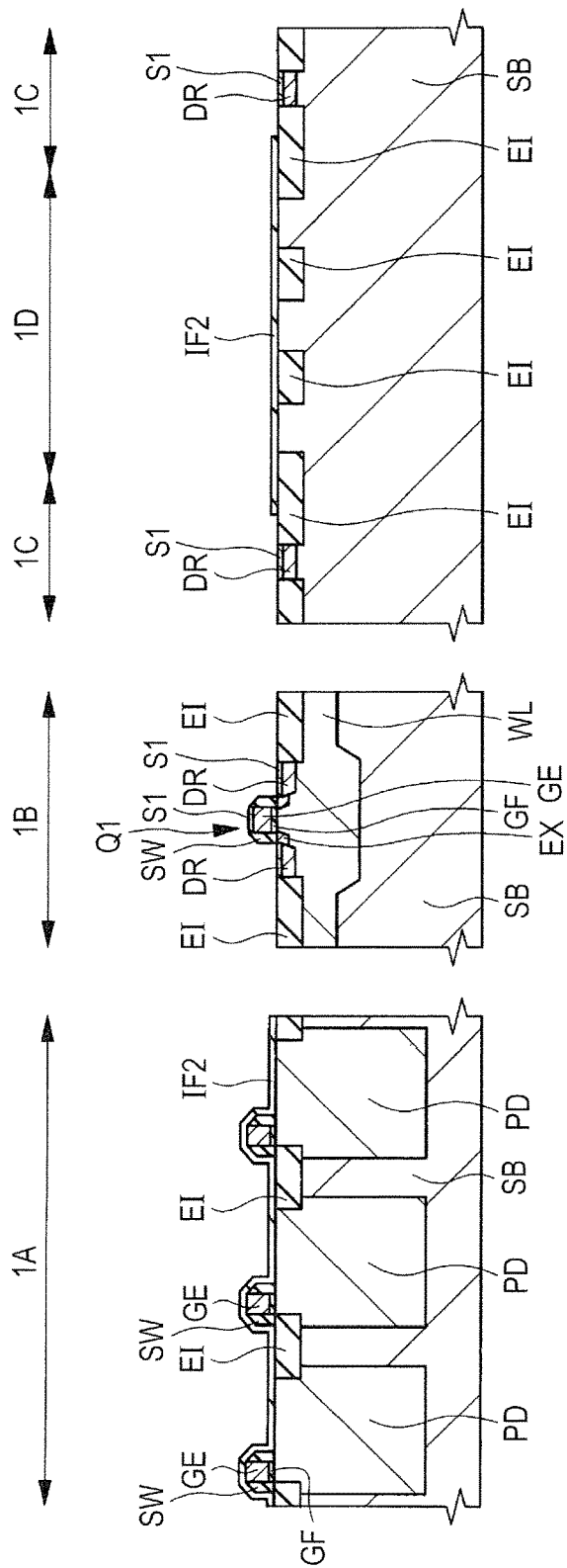
FIG. 8 is a cross-sectional view that explains a manufacturing step for the semiconductor device subsequent to FIG. 7.

Next, as shown in FIG. 8, by executing known salicide process, a silicide layer S1 is formed over the upper surface of the semiconductor substrate SB or the gate electrode GE exposed in the pixel region 1A, the peripheral circuit region 1B, and the seal ring region 1C. Here, a metal film is deposited over the entire surface of the main surface of the semiconductor substrate SB using a sputtering method for example. The metal film is formed of Co (cobalt) or Ni (nickel) and the like for example. The film thickness of the metal film is approximately several ten nm for example.

Next, the semiconductor substrate SB is heated by executing a heat treatment of approximately 500° C. Thus, the metal film and the semiconductor layer that is in contact with the metal film react with each other, and the silicide layer S1 is formed. The silicide layer S1 is formed of CoSi (cobalt silicide) or NiSi (nickel silicide) for example. In concrete terms, explanation will be made assuming that the silicide layer S1 formed of CoSi is formed here.

Here, the silicide layer having high metal content is formed also in the surface of the insulation film IF2 and the insulation film of the element separation region EI or the side wall SW and the like. However, the rate of Si (silicon) contained in the silicide layer S1 formed so as to contact the upper surface of the semiconductor substrate SB or the upper surface of the gate electrode GE with respect to Co (cobalt) is higher than the rate of Si (silicon) contained in the silicide layer formed over the surface of the insulation film IF2 and the insulation film of the element separation region EI or the side wall SW and the like with respect to Co (cobalt).

Next, wet etching and the like by mixed liquid of sulfuric acid and hydrogen peroxide aqueous solution and the like is executed. Thus, the metal film that is unreacted is removed. At this time, the silicide layer having low rate of Si (silicon) content with respect to Co (cobalt) content is removed. In other words, the silicide layer that covers the surface of the insulation film IF2 and the insulation film of the element separation region EI or the side wall SW and the like is removed. On the other hand, the silicide layer S1 that is formed so as to contact the upper surface of the semiconductor substrate SB or the upper surface of the gate electrode GE is not removed because the silicon content is high. Thereafter, a heat treatment of approximately 800° C. is further executed. By this heat treatment, in the composition of the silicide layer S1, the ratio of cobalt and silicon becomes 1:2.

The silicide layer S1 is in contact with the upper surface of the gate electrode GE. Also, the silicide layer S1 is in contact with the upper surface of the source-drain region, that is, the upper surface of the semiconductor substrate SB.

Here, because the upper surface of the photodiode PD of the pixel region 1A is covered with the insulation film IF2, the upper surface and the metal film do not react with each other in the salicide process described above. Therefore, the silicide layer is not formed in the surface of the photodiode PD. Thus, by preventing formation of the silicide layer in the surface of the photodiode PD, the light incident to the solid-state imaging element that is formed later is prevented from being reflected by the silicide layer that covers the photodiode PD. However, each electrode of the peripheral transistor exposed from the insulation film IF2 in a region that is within the pixel region 1A but is not illustrated is covered with the silicide layer.

In the peripheral circuit region 1B, the sheet resistance of each of the gate electrode GE and the source-drain region covered with the silicide layer S1 can be reduced. Also, by formation of the silicide layer S1, the coupling resistance between a plug that is formed in a later step and each of the gate electrode GE and the source-drain region can be reduced.

Here, as a main feature of the present embodiment, in the scribe region 1D, the silicide layer S1 is not formed in the upper surface of the semiconductor substrate SB which is the dummy pattern of the element separation region. In other words, because the upper surface of the semiconductor substrate SB exposed from the element separation region EI between the neighboring element separation regions EI is covered with the insulation film IF2, the upper surface and the metal film do not react with each other in the salicide process described above. Therefore, the silicide layer S1 is not formed in the scribe region 1D. Accordingly, even after the forming step for the silicide layer S1, the upper surface of the semiconductor substrate SB in the scribe region 1D is in directly contact with the insulation film IF2 that is formed over the semiconductor substrate SB and over the element separation region EI.

Figure 9:
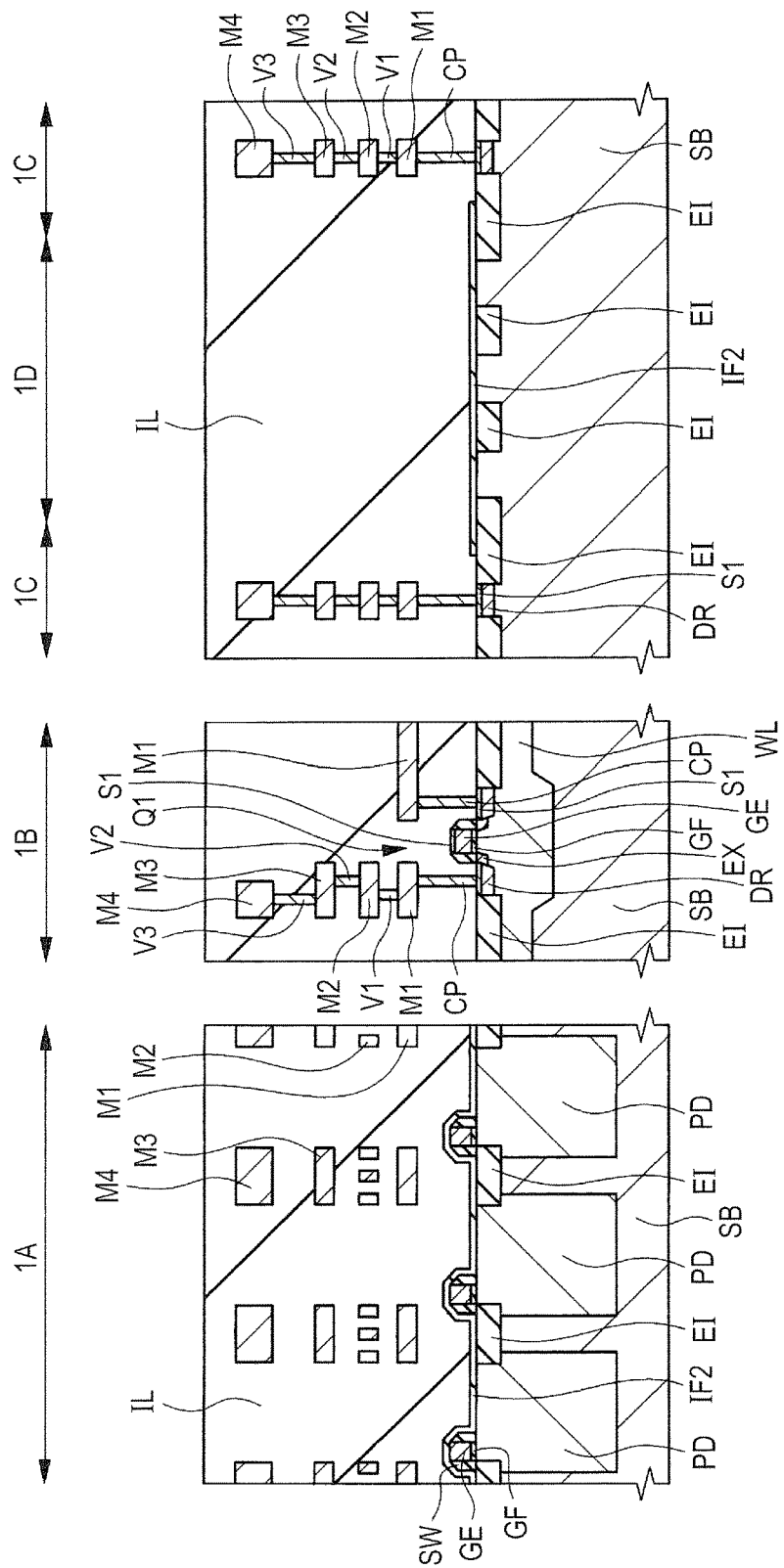
FIG. 9 is a cross-sectional view that explains a manufacturing step for the semiconductor device subsequent to FIG. 8.

Next, as shown in FIG. 9, plural wiring layers are laminated over the semiconductor substrate SB. In concrete terms, first, a first interlayer insulation film (an interlayer insulation film of the contact layer) is formed using the CVD method for example so as to cover the upper surface of the semiconductor substrate SB, the transistor Q1, and the like. The first interlayer insulation film is formed of a silicon oxide film for example. Next, the upper surface of the first interlayer insulation film is flattened by the CMP method and the like. Thereafter, plural contact holes that penetrate the first interlayer insulation film are opened using the photolithography technology and the dry etching method. At the bottom of the contact holes, the upper surfaces of the silicide layers S1 over the upper surface of each of the gate electrode GE of the transistor Q1 and the diffusion region DR of the source-drain region or the seal ring region 1C are exposed. Also, the contact hole is not formed right above the photodiode PD.

Next, by depositing a metal film mainly formed of tungsten (W) over the first interlayer insulation film that includes the inside of the contact holes, the metal film is embedded inside the contact holes. Thereafter, by removing the excess metal film over the first interlayer insulation film using the CMP method and the like, the upper surface of the first interlayer insulation film is exposed. Thus, plugs (contact plugs) CP formed of the metal film that is embedded in each of the plural contact holes are formed. The plug CP is configured of a laminated film that includes a titanium nitride film and a tungsten film for example, the titanium nitride film covering the lateral wall and the bottom surface inside the contact hole, the tungsten film being embedded inside the contact hole through the titanium nitride film over the bottom surface. The titanium nitride film is a barrier metal film, and is formed by the CVD method or the sputtering method. Also, the tungsten film is a main conductor film, and is formed by the CVD method for example. The first interlayer insulation film and the plugs CP configure the contact layer.

Next, over each of the first interlayer insulation film and the plugs CP, a second interlayer insulation film and wiring M1 are formed using a so-called single damascene method for example, the wiring M1 being embedded inside a wiring trench that penetrates the second interlayer insulation film. The wiring M1 is mainly formed of a copper (Cu) film for example, and the second interlayer insulation film is formed of a silicon oxide film for example. Further, it is also possible not to use the single damascene method but to work an aluminum film and the like deposited over the plug CP to form the wiring M1, and to form the second interlayer insulation film that covers the wiring M1. The second interlayer insulation film and the wiring M1 configure a first wiring layer.

Next, over the first wiring layer, a second wiring layer is formed which includes a third interlayer insulation film, wiring M2, and a via V1. The second wiring layer is formed using a so-called dual damascene method for example. In other words, the third interlayer insulation film is formed over the second wiring layer using the CVD method and the like, a wiring trench is thereafter formed in the upper surface of the third interlayer insulation film, and a via hole is formed which starts from the bottom surface of the wiring trench and reaches the bottom surface of third interlayer insulation film. Thereafter, by filling the inside of the wiring trench and the inside of the via hole with a metal film mainly formed of a copper film, the wiring M2 inside the wiring trench and the via V1 inside the via hole are formed.

Next, a step similar to that of the second wiring layer is executed, and a third wiring layer over the second wiring layer is formed. The third wiring layer includes a fourth interlayer insulation film over the wiring M2, a via V2, and wiring M3 over the via V2. Next, a coupling layer is formed over the third wiring layer. The coupling layer includes a fifth interlayer insulation film that is formed of a silicon oxide film for example, and a via V3 that penetrates the fifth interlayer insulation film. The via V3 is formed by embedding a metal film inside a via hole that is formed by working the fifth interlayer insulation film, the metal film being mainly formed of a copper film.

Next, after forming an aluminum film over the coupling layer using the sputtering method for example, the aluminum film is worked using the photolithography technology and the etching method. Thus, wiring M4 formed of the aluminum film is formed. Thereafter, a sixth interlayer insulation film is formed over the coupling layer and the wiring M4 using the CVD method for example. The sixth interlayer insulation film is formed of a silicon oxide film for example. Next, the upper surface of the sixth interlayer insulation film is flattened using the CMP method for example. By the above, a laminated wiring layer over the semiconductor substrate is formed. In the drawing, illustration of the boundary between the first to sixth interlayer insulation films is omitted, and the first to sixth interlayer insulation films are illustrated as one interlayer insulation film IL.

In the peripheral circuit region 1B, the wiring M4 is coupled with the transistor Q1 through the via V3, the wiring M3, the via V2, the wiring M2, the via V1, the wiring M1, the plug CP, and the silicide layer S1. Also, in the seal ring region 1C, the wiring M4 is coupled with the diffusion region DR through the via V3, the wiring M3, the via V2, the wiring M2, the via V1, the wiring M1, the plug CP, and the silicide layer S1.

In the seal ring region 1C, the wiring M4, the via V3, the wiring M3, the via V2, the wiring M2, the via V1, the wiring M1, and the plug CP which are formed so as to overlap in plan view configure a seal ring. These metal films configuring the seal ring are protection films formed for preventing the crack generated at the end section of the semiconductor chip from reaching the pixel region 1A or the peripheral circuit region 1B in a later dicing step, and therefore the metal films are disposed so as to overlap as described above.

Further, although it is not illustrated, in the scribe region 1D, there is also a position where the wiring M4, the via V3, the wiring M3, the via V2, the wiring M2, the via V1, the wiring M1, and the plug CP are formed as a mark.

Figure 10:
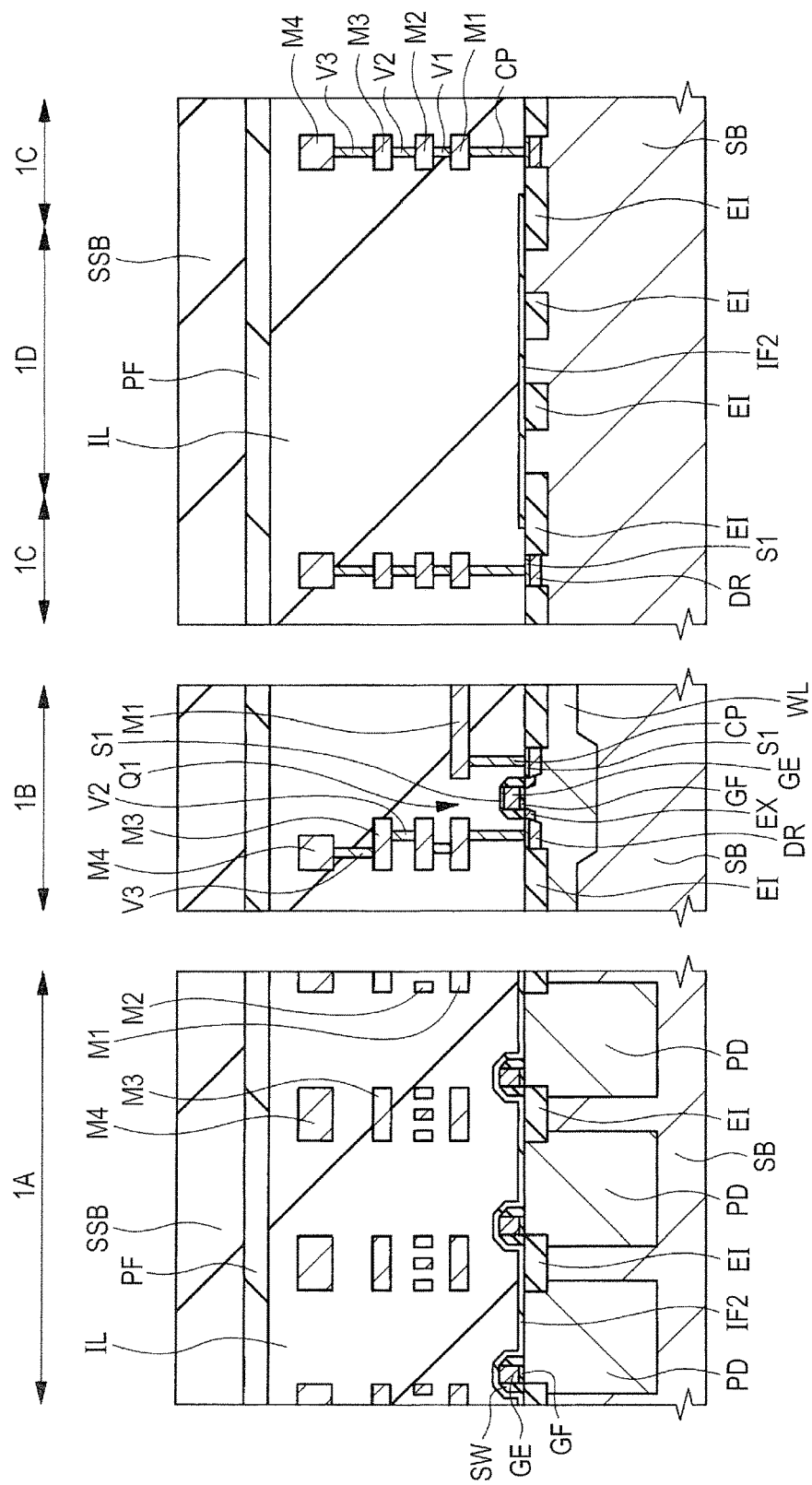
FIG. 10 is a cross-sectional view that explains a manufacturing step for the semiconductor device subsequent to FIG. 9.

Next, as shown in FIG. 10, over the upper surface of the interlayer insulation film IL, a passivation film PF that becomes a surface protection film is formed. This passivation film PF is configured of a silicon oxide film and a silicon nitride film for example, and can be formed by the CVD method for example, the silicon nitride film being disposed over this silicon oxide film. Next, the upper surface of the passivation film PF is flattened using the CMP method for example. Thereafter, a support substrate (wafer) SS is joined to the upper surface of the passivation film PF.

Figure 11:
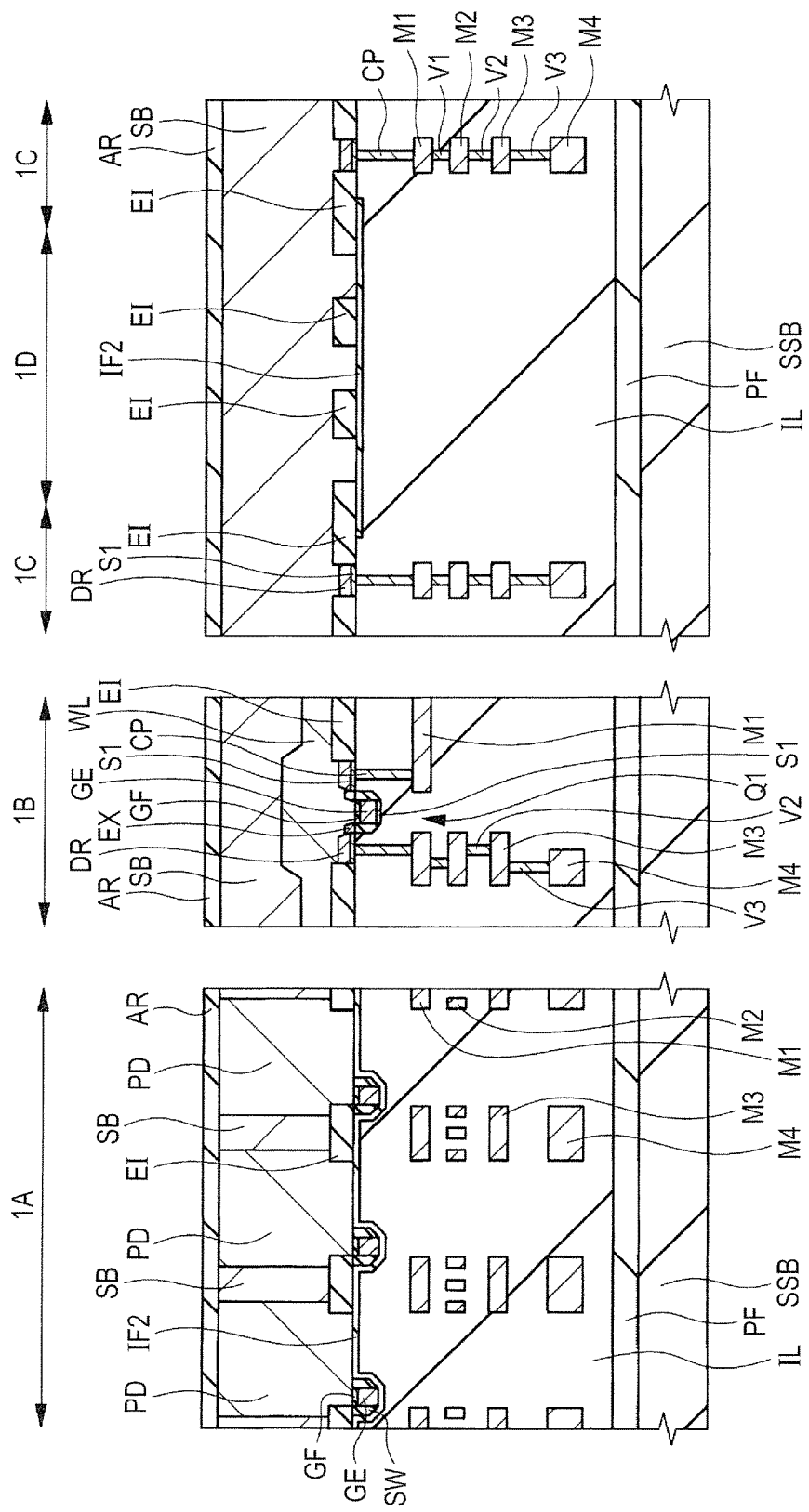
FIG. 11 is a cross-sectional view that explains a manufacturing step for the semiconductor device subsequent to FIG. 10.

Next, as shown in FIG. 11, the semiconductor substrate SB is inverted so that the support substrate SS comes to the lower side and the semiconductor substrate SB comes to the upper side. That is to say, the top and bottom of the semiconductor substrate SB are reversed. Next, the upper surface of the semiconductor substrate SB, that is, the back surface (the second surface) is polished until the thickness of the semiconductor substrate SB becomes 10 μm. At this time, the well WL and the element separation region EI are not exposed. Here, in the back surface of the semiconductor substrate SB polished, a part of the photodiode PD is exposed. Further, here, although the thickness of the semiconductor substrate SB becomes 10 μm by polishing, the semiconductor substrate SB may be made thin to approximately 3 μm for example.

Next, over the back surface of the semiconductor substrate SB, an anti-reflection film AR is formed using the CVD method for example. The anti-reflection film AR is a film that has a role of preventing the light incident to the photodiode PD from the back surface side of the semiconductor substrate SB from being reflected at the back surface of the semiconductor substrate SB, and is formed of a silicon nitride film for example.

Figure 12:
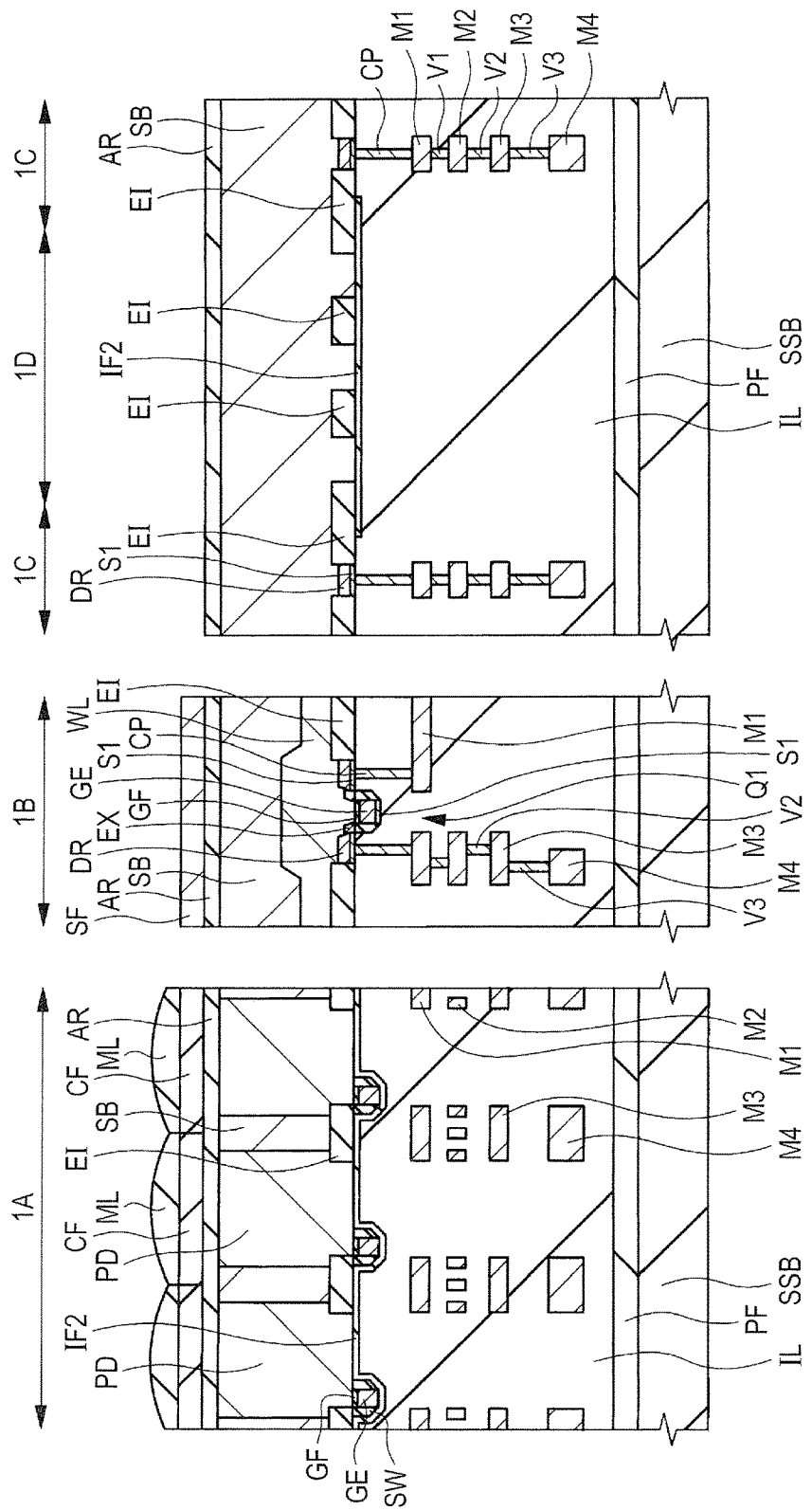
FIG. 12 is a cross-sectional view that explains a manufacturing step for the semiconductor device subsequent to FIG. 11.

Next, as shown in FIG. 12, over the anti-reflection film AR of the pixel region 1A, color filters CF and microlenses ML are formed in order. The color filter CF is formed of a film for example which is formed of material that transmits light having a predetermined wavelength and blocks light having other wavelength. The microlens ML over the color filter CF is formed by working a film formed over the color filter CF into a pattern having a circular shape in plan view, thereafter heating the film for example, thereby rounding the surface including the upper surface and the lateral wall of the film, and thereby working the film into a lens shape. Also, over the anti-reflection film AR of the peripheral circuit region 1B, a light shielding film SF is formed. The light shielding film SF is formed of a metal film for example. In the scribe region 1D, although the anti-reflection film AR is formed, the color filter CF, the microlens ML, and the light shielding film SF are not formed.

Figure 13:
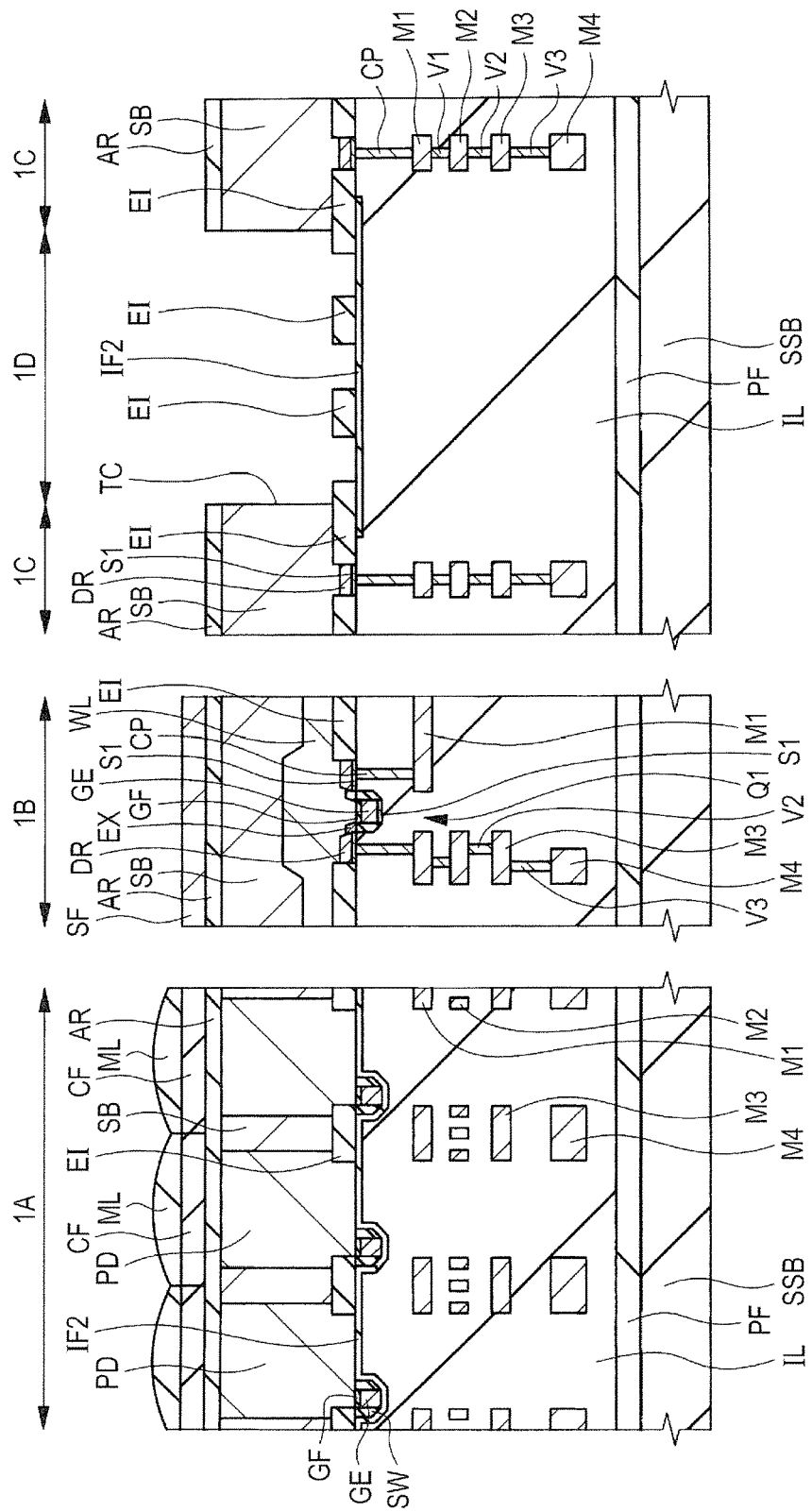
FIG. 13 is a cross-sectional view that explains a manufacturing step for the semiconductor device subsequent to FIG. 12.
Figure 14:
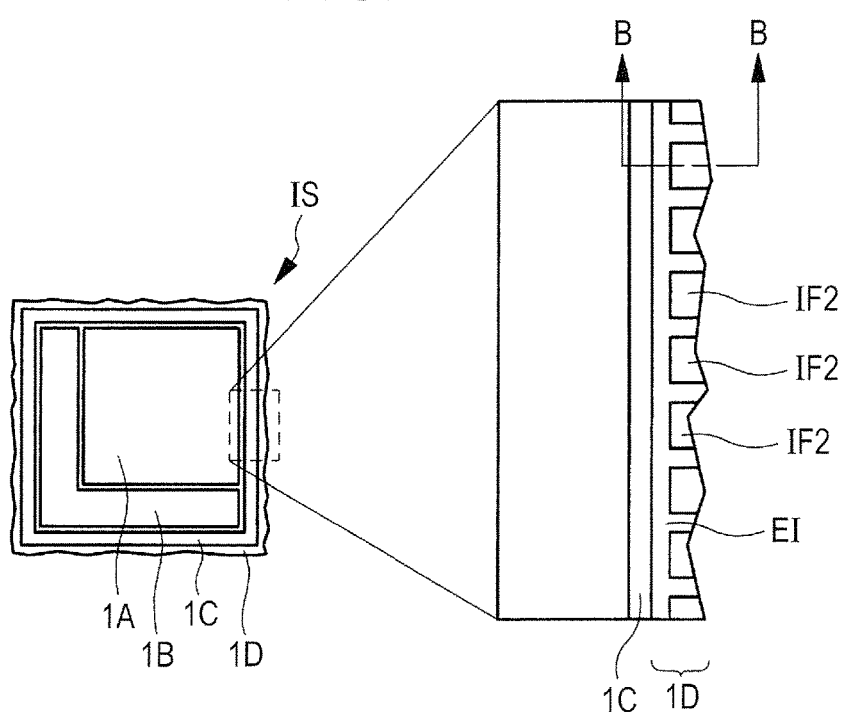
FIG. 14 is a plan view that explains a manufacturing step for the semiconductor device subsequent to FIG. 13.

Next, as shown in FIG. 13, an opening is formed in the anti-reflection film AR and the semiconductor substrate SB of the scribe region 1D using the photolithography technology and the dry etching method. Thus, the upper surface of the element separation region EI and the upper surface of the insulation film IF2 of the scribe region 1D are exposed. That is to say, a trench TC that penetrates the semiconductor substrate SB is formed.

Here, after removing the anti-reflection film AR, dry etching which is anisotropic etching is executed with an etching condition of selectively removing silicon. In other words, etching is executed with a condition having a selectivity for silicon oxide and silicon nitride. In the etching, a part of the semiconductor substrate SB formed of silicon is removed, whereas the element separation region EI and the insulation film (silicide protection film) IF2 right below the removed semiconductor substrate SB remain. Also, the upper surface of each of the element separation region EI and the insulation film IF2 mentioned here means the bottom surface of the time of forming the element separation region EI and the insulation film IF2.

The trench TC is formed so as to avoid a position where the wiring M4, the via V3, the wiring M3, the via V2, the wiring M2, the via V1, the wiring M1, and the plug CP existing as a mark in the scribe region 1D are formed.

At this time, the silicide layer is not formed in the main surface (the first surface) of the semiconductor substrate SB of the scribe region 1D because the insulation film IF2 is formed. Therefore, even when the etching is executed and the semiconductor substrate SB is removed, the silicide layer is not exposed in the bottom of the trench TC, and the insulation film IF2 is exposed below a region between the neighboring element separation regions EI. Also, both of the silicide layer and the metal wire are not formed between the insulation film IF2 and the interlayer insulation film IL as well as inside the interlayer insulation film IL.

Also, in the forming step for the trench TC, in order to form an electrode pad (electrode) of the solid-state imaging element at a position not illustrated within the chip region CHR (refer to FIG. 1), the solid-state imaging element being formed later, the anti-reflection film AR and the semiconductor substrate SB are opened to form a through hole. The electrode pad is a coupling section for coupling a bonding wire and the like to the solid-state imaging element that is a semiconductor chip.

As described above, because the opening step for the trench TC is executed simultaneously with the opening step that is executed for forming the electrode pad, even when the trench TC of the scribe region 1D is formed, the manufacturing step for the semiconductor device does not increase.

Also, the trench TC formed in the scribe region 1D becomes a guide for measuring the position for cutting by the dicing blade in the dicing step executed later. Therefore, an effect of facilitating dicing can be secured. Also, by removing the semiconductor substrate SB of the scribe region 1D that is the region for executing dicing, breakage (chipping) of the semiconductor wafer can be prevented. Also, when the trench TC is formed, the object of cutting in the dicing step becomes thin, and therefore an effect that dicing becomes easy can be secured. With the aim of securing the effects described above and so on, the trench TC is formed in the scribe region 1D in the present embodiment.

Next, although illustration will be omitted, by removing the insulating film (the first interlayer insulating film) for example right below the opening section of the semiconductor substrate SB of a position not illustrated within the chip region CHR (refer to FIG. 1), the upper surface of the wiring is exposed. The upper surface of the wiring mentioned here means the bottom surface of the time when the wiring was formed. Thereafter, a via for filling the inside of the opening section (through hole, via hole) is formed, and the electrode pad formed of an aluminum film for example is formed at the upper part of the via.

The electrode pad is electrically coupled with a circuit inside the chip region CHR through the via and the wiring. The electrode pad is a coupling section for coupling a bonding wire for electrically coupling the solid-state imaging element that is formed later and the outside of the solid-state imaging element by the boding wire and the like. Also, instead of forming the electrode pad over the opening section, the electrode pad may be formed at the bottom of the opening section. That is to say, here, the electrode pad is formed inside the opening section or over the opening section.

Figure 15:
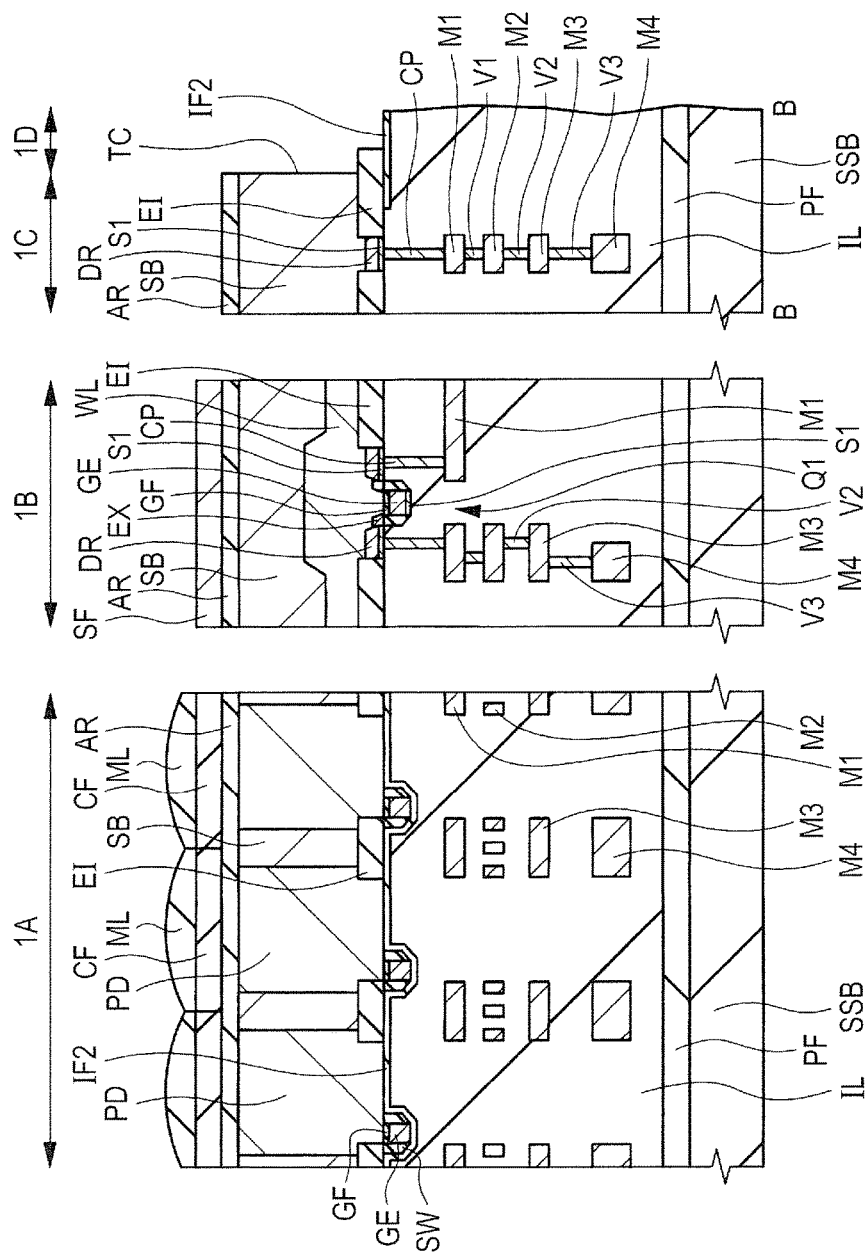
FIG. 15 is a cross-sectional view that includes a cross section taken along the line B-B of FIG. 14.

Next, as shown in FIG. 14 and FIG. 15, a dicing step is executed and the semiconductor wafer is singulated. Thus, the solid-state imaging elements IS that are plural semiconductor chips can be obtained. In other words, the solid-state imaging element IS that is the semiconductor device of the present embodiment is completed. In FIG. 14, there are shown a plan view of the solid-state imaging element IS and a plan view in which a part of the end section of the solid-state imaging element IS is enlarged. The cross-sectional view which includes the seal ring region 1C and the scribe region 1D of FIG. 15 shows the cross section taken along the line B-B of FIG. 14.

In concrete terms, in the dicing step, the semiconductor wafer is separated into individual semiconductor chip by cutting the scribe region (scribe line) 1D of the semiconductor wafer using a dicing blade. The solid-state imaging element IS mainly includes the chip region CHR (refer to FIG. 1), and includes a part of the scribe region 1D at the end section.

The width of the dicing blade that is used then is narrower than the width in the transverse direction of the scribe region 1D. The reason a part of the scribe region 1D is left thus is that, because the cutting surface is not flat but has unevenness as illustrated in FIG. 14, it is necessary to prevent the chip region CHR (refer to FIG. 1) that includes the seal ring region 1C, the peripheral circuit region 1B, and the pixel region 1A from being cut. In other words, because the range where cutting is executed disperses, cutting should be executed at a position that departs from the seal ring region 1C to some extent.

Therefore, the end section of the scribe region 1D is inevitably left as a part of the end section of the solid-state imaging element IS. As shown in FIG. 14 and FIG. 15, in the scribe region 1D of the end section of the solid-state imaging element IS, the upper surface of the element separation region EI that is exposed from the semiconductor substrate SB and the upper surface of the insulation film IF2 are exposed. That is to say, the upper surface of the insulation film IF2 exposed from the semiconductor substrate SB in the scribe region 1D is not covered with the silicide layer. In other words, the silicide layer is not formed over the upper surface of the insulation film IF2 that is exposed from the semiconductor substrate SB in the scribe region 1D, and the upper surface of the insulation film IF2 is exposed from the silicide layer.

In the dicing step described above, the element separation regions EI, the insulation film IF2, the interlayer insulation film IL, the passivation film PF, and the support substrate SSB of the scribe region 1D shown in FIG. 13 and the wiring M4, the via V3, the wiring M3, the via V2, the wiring M2, the via V1, the wiring M1, and the plug CP which exist in the scribe region 1D are cut. Here, at the time of cutting, cutting is executed so that the wiring M4, the via V3, the wiring M3, the via V2, the wiring M2, the via V1, the wiring M1, and the plug CP which exist in the scribe region 1D are cut away entirely.

Below, the structure shown in FIG. 15 will be explained. As shown in FIG. 15, the solid-state imaging element that is a semiconductor device of the present embodiment includes the support substrate SSB and the wiring layer that is formed over the support substrate SSB. Also, over the wiring layer, the semiconductor substrate SB is formed which includes the photodiodes PD in the inside, the photodiode PD being a light receiving element. The end section of the upper surface of the wiring layer, that is, the upper surface of the wiring layer in the scribe region 1D is exposed from the semiconductor substrate SB, and is covered only with the element separation region EI and the insulation film IF2. The upper surface of each of the element separation region EI and the insulation film IF2 of the scribe region 1D is exposed from the semiconductor substrate SB. The element separation region EI of the pixel region 1A and the peripheral circuit region 1B is formed of an insulation film that is embedded inside a trench that is formed at the lower surface of the semiconductor substrate SB.

The photodiodes PD are formed at the lower surface of the semiconductor substrate SB. In the peripheral circuit region 1B, the source-drain region and the transistor Q1 are formed in the vicinity of the lower surface of the semiconductor substrate SB. The source-drain region is formed inside the semiconductor substrate SB, and the transistor Q1 includes the gate electrode GE that is formed below the semiconductor substrate SB through the gate insulation film GF. A silicide layer S1 is in contact with the lower surface of the source-drain region, that is, the lower surface of the semiconductor substrate SB, and another silicide layer S1 is in contact with the lower surface of the gate electrode GE also.

On the other hand, the lower surface of the photodiode PD is exposed from the silicide layer S1, and is covered with the insulation film IF2 that is formed below the semiconductor substrate SB. In other words, the photodiode PD does not overlap with the silicide layer S1 in plan view. Also, because the silicide layer S1 is not formed in the scribe region 1D, the end section of the upper surface of the wiring layer exposed from the semiconductor substrate SB, that is, the upper surface of the wiring layer of the scribe region 1D is exposed from the silicide layer S1.

Effect of the Present Embodiment

Below, the effect of the method for manufacturing a semiconductor device of the present embodiment will be explained using a comparative example shown in FIG. 29. FIG. 29 is a cross-sectional view of a solid-state imaging element that is a semiconductor device of the comparative example. The cross-sectional view shown in FIG. 29 corresponds to the cross-sectional view shown in FIG. 13. That is to say, in FIG. 29, the pixel region 1A, the peripheral circuit region 1B, the seal ring region 1C, the scribe region 1D, and the seal ring region 1C are shown in this order from the left side.

The semiconductor device of the comparative example is a solid-state imaging element of the back side illumination type, and arranges a dummy pattern in the scribe region 1D with an aim of preventing dishing and so on similarly to the present embodiment, the dummy pattern being a position where the element separation region EI is not formed.

In the manufacturing step for the semiconductor device of the comparative example shown in FIG. 29, first, steps similar to those shown in FIG. 1 to FIG. 6 are executed similarly to the present embodiment. At this time, in the scribe region 1D, a part of the main surface of the semiconductor substrate SB is exposed from the element separation region EI.

Thereafter, with an aim of reducing the resistance of the electrode of the transistor Q1 and so on, the silicide layer S1 is formed which covers the surface of the gate electrode GE and the source-drain region of the transistor Q1. In the comparative example, because the insulation film IF2 that covers the surface of the photodiode PD of the pixel region 1A is formed as a silicide protection film before the forming step for this silicide layer S1, a silicide layer is not formed over the surface of the photodiode PD. However, because the insulation film IF2 is not formed in the scribe region 1D, the silicide layer S1 is formed so as to cover the main surface of the semiconductor substrate SB which is exposed in the forming step for the silicide layer.

Next, the laminated wiring layer and the passivation film PF are formed by executing steps similar to those explained using FIG. 9 and FIG. 10, and the support substrate SSB is thereafter joined to the passivation film PF. Then, as explained using FIG. 11 and FIG. 12, the top and bottom of the semiconductor substrate SB are reversed, the semiconductor substrate SB is made a thin film, and the antireflection film AR, the color filters CF, the microlenses ML, and the light shielding film SF are thereafter formed.

Next, similarly to the step explained using FIG. 13, the semiconductor substrate SB of the scribe region 1D is removed and the trench TC is formed using the photolithography technology and the dry etching method. At the bottom of the trench TC, the surface of the element separation region EI is exposed. Also, as shown in FIG. 29, at the bottom of the trench TC, the upper surface of the silicide layer S1 that covers the upper surface of the interlayer insulation film IL is exposed in a region (dummy pattern) between the neighboring element separation regions EI. The upper surface of the silicide layer S1 mentioned here means the bottom surface of the silicide layer S1 of the time of forming the silicide layer S1.

Thus, because the silicide layer S1 is formed over the main surface of the semiconductor substrate SB of the scribe region 1D in the comparative example, when the semiconductor substrate SB of the scribe region 1D is selectively removed by the dry etching method, the silicide layer S1 having selectivity for the dry etching remains without being removed, and is exposed at the bottom of the trench TC. Here, because the semiconductor substrate SB of the scribe region 1D is entirely removed by etching, in order to surely remove the semiconductor substrate SB having the film thickness of 10 μm, in addition to the time required for removing the silicon layer having the thickness of 10 μm, etching is executed for long hours so as to be capable of further removing the silicon layer having the thickness of approximately 2 to 3 μm. That is to say, in order to prevent shortage of the etching amount, over-etching is executed.

Even when etching is executed until the upper surface of the element separation region EI is exposed, it is necessary to execute over-etching. In this case, because several hundred nm that is the thickness of the element separation region EI is quite small magnitude compared to the etching amount executed for removing the semiconductor substrate SB having the film thickness of 10 μm, the silicide layer S1 is exposed by over-etching.

Therefore, if the silicide layer S1 is formed at the bottom of the trench TC, even when the dry etching is executed with a condition of having high selectivity for the silicide layer S1, a part of the silicide layer S1 is removed by the dry etching. When the silicide layer S1 is subjected to etching thus, contamination occurs inside the etching device, and the characteristics of the solid-state imaging element thereby deteriorate. For example, such problem and the like occurs that white dots constantly appear in a part of an image obtained by imaging because cobalt having formed the silicide layer diffuses into the photodiode region of a certain pixel accompanying contamination.

Next, in order to obtain plural solid-state imaging elements from the semiconductor wafer, the scribe region 1D is cut using a dicing blade. At this time, in the scribe region 1D, because the silicide layer S1 is formed between neighboring element separation regions EI, the silicide layer S1 is also cut by the dicing blade. In the cutting step, although the wiring M4, the via V3, the wiring M3, the via V2, the wiring M2, the via V1, the wiring M1, and the plug CP existing in the scribe region 1D are entirely cut away, the silicide layer is not entirely cut away, and scatters to the surrounding area.

When the silicide layer having scattered then adheres to the surface of the solid-state imaging element, such problem occurs that sufficient light is not irradiated into the photodiode of the pixel and a black dot constantly appears at a part of an image obtained by imaging. Also, when a part of the silicide layer having scattered adheres to the electrode pad, there is a risk that a short circuit through the silicide layer occurs, and there is a risk that a junction defect occurs in joining the bonding wire to the electrode pad of the solid-state imaging element. When such problems as described above occur, the reliability of the semiconductor device deteriorates.

Therefore, in the present embodiment, the insulation film IF2 (refer to FIG. 7) is formed not only in the pixel region 1A but also in the scribe region 1D, the insulation film IF2 being formed so as to cover the photodiode PD before the silicide layer is formed. Therefore, as shown in FIG. 8, the silicide layer S1 is formed neither right above the photodiode PD nor right above the semiconductor substrate SB of the scribe region 1D.

As a result, as shown in FIG. 13, when the semiconductor substrate SB of the scribe region 1D is removed by etching, the silicide layer can be prevented from being etched. Thus, occurrence of contamination inside an etching device because the silicide layer is exposed to etching can be prevented, and therefore deterioration of the characteristics of the solid-state imaging element can be prevented.

Also, when dicing is executed as shown in FIG. 14 and FIG. 15 after the etching step, because the silicide layer is not formed in the scribe region 1D, the silicide layer can be prevented from being cut and scattered. Therefore, deterioration of the characteristics of the solid-state imaging element caused by adhesion of a part of the silicide layer to the surface of the solid-state imaging element can be prevented.

Also, because such event can be prevented that a part of the silicide layer scatters and adheres to the electrode pad and the like, occurrence of the short circuit can be prevented, and occurrence of the junction defect of the bonding wire can be prevented.

From the above, by applying the semiconductor device of the present embodiment and the method for manufacturing the same, reliability of the semiconductor device can be improved.

Also, in the manufacturing step for the semiconductor device of the present embodiment, the forming step for the insulation film IF2 of the scribe region 1D shown in FIG. 7 is executed so as to double as a forming step for a silicide protection film (insulation film IF2) that covers the photodiode PD or the resistive element and so on for which it is necessary to prevent formation of the silicide layer. Therefore, even when the insulation film IF2 is formed in the scribe region 1D, the manufacturing step for the semiconductor substrate SB does not increase.

Also, the step for removing the semiconductor substrate SB of the scribe region 1D by dry etching as shown in FIG. 13 is executed so as to double as the forming step for the via hole where a via is embedded, the via being for coupling the electrode pad of the solid-state imaging element of the back side illumination type and the wiring inside the wiring layer. Therefore, even when the semiconductor substrate SB of the scribe region 1D is removed and the trench TC is formed, the manufacturing step for the semiconductor substrate SB does not increase.

From the above, such effect can be secured that deterioration of reliability of the solid-state imaging element caused by contamination and the like is prevented without increasing the manufacturing cost of the semiconductor device.

First Modification

Figure 16:
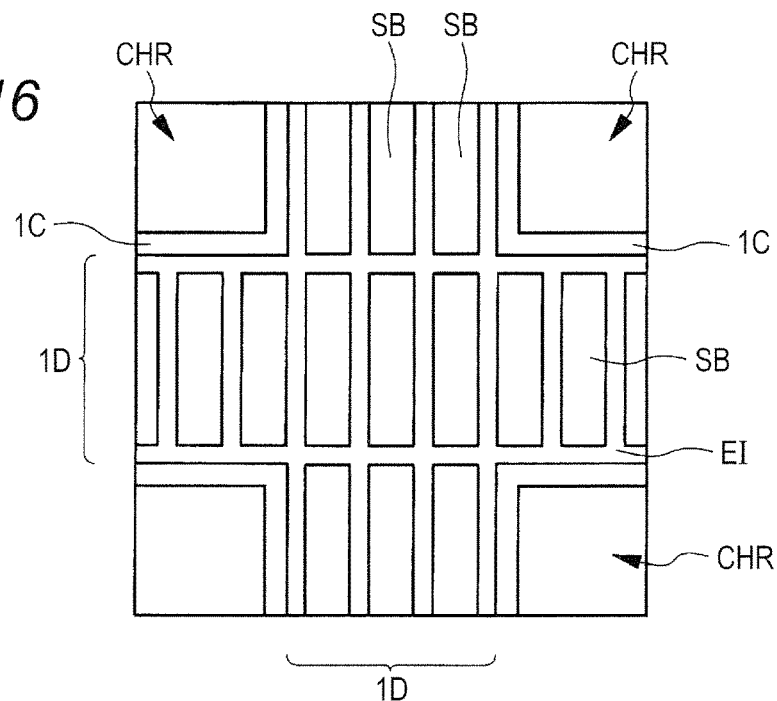
FIG. 16 is a plan view that explains a manufacturing step for a semiconductor device which is the first modification of the first embodiment of the present invention.

In FIG. 16, a plan view of a semiconductor device that is the first modification of the present embodiment is shown. FIG. 16 is an enlarged plan view corresponding to FIG. 2.

Although a layout of a case the pattern (dummy pattern) of the upper surface of the semiconductor substrate SB surrounded by the element separation region EI of the scribe region 1D has a square shape in plan view is shown in FIG. 2, the shape of the pattern is not limited to the square shape. For example, the plan layout of the dummy pattern may be a rectangle as shown in FIG. 16. Also, the shape of the dummy pattern in plan view is not limited to a square, rectangle, and the like, and may be a circle, or polygon, and the like for example.

Even when the layout of the dummy pattern is changed thus, if the element separation region EI and the dummy pattern that is the upper surface of the semiconductor substrate SB exposed from the element separation region EI are properly disposed so that the area of each does not become excessively large within a constant range, occurrence of dishing in the polishing step that is executed at the time of forming the element separation region EI can be prevented. Therefore, even in such solid-state imaging element as explained in the present modification, an effect similar to that of the solid-state imaging element explained using FIG. 1 to FIG. 15 can be secured.

Second Modification

Figure 17:
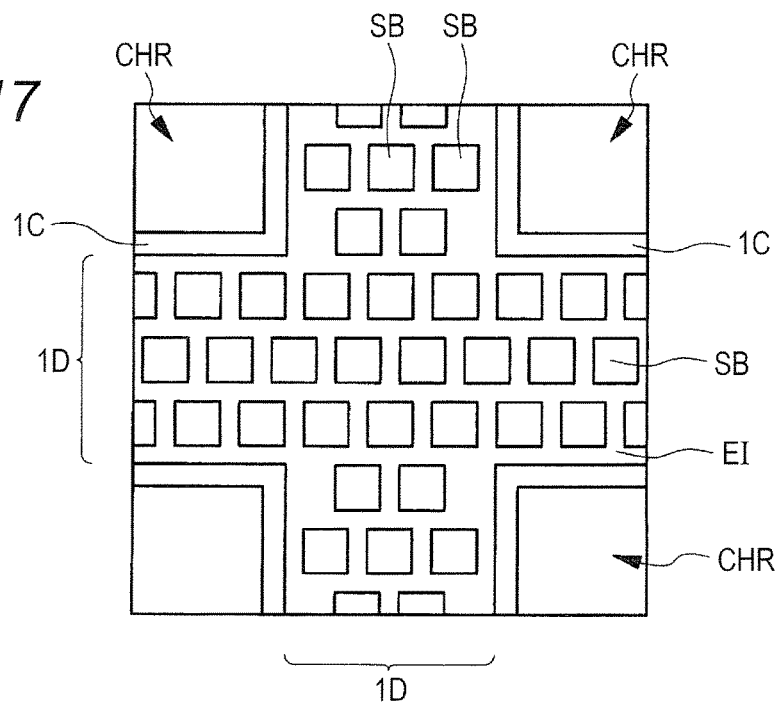
FIG. 17 is a plan view that explains a manufacturing step for a semiconductor device which is the second modification of the first embodiment of the present invention.

In FIG. 17, a plan view of a semiconductor device that is the second modification of the present embodiment is shown. FIG. 17 is an enlarged plan view corresponding to FIG. 2.

Although a layout of a case the dummy patterns of the scribe region 1D line up in an array shape is shown in FIG. 2, the arrangement of the dummy pattern may not be in an array shape. For example, in a case plural chip regions CHR line up in a matrix shape, plural dummy patterns may line up periodically in a diagonal direction with respect to its line direction and column direction.

Even if the layout of the arrangement of the dummy pattern is changed thus, when the element separation region EI and the dummy patterns are arranged properly, occurrence of dishing in the polishing step that is executed at the time of forming the element separation region EI can be prevented. Therefore, even in such solid-state imaging element as explained in the present modification, an effect similar to that of the solid-state imaging element explained using FIG. 1 to FIG. 15 can be secured.

Second Embodiment

Figure 18:
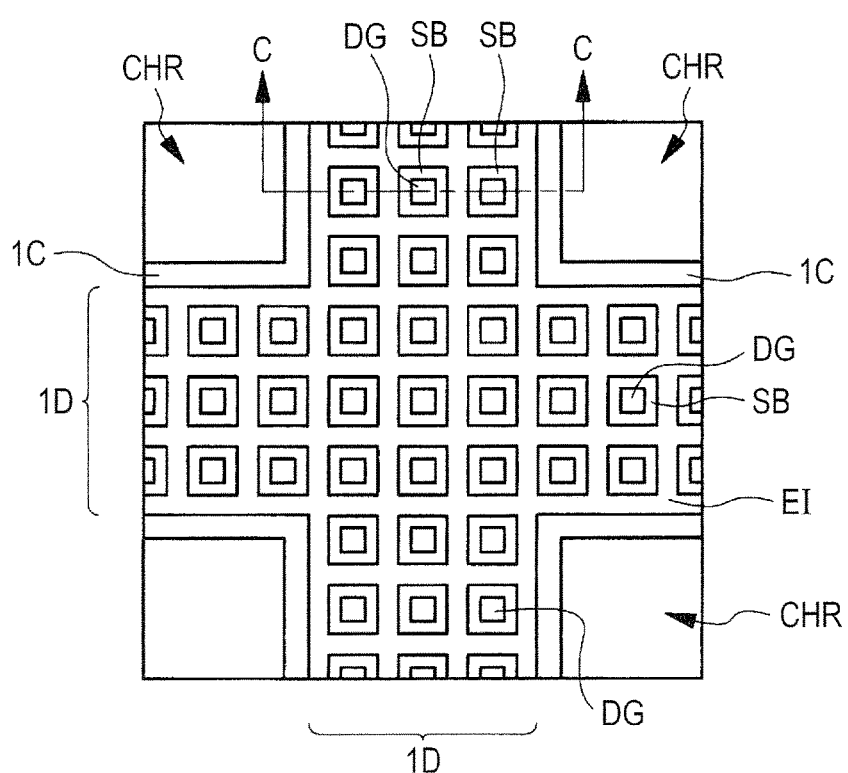
FIG. 18 is a plan view that explains a manufacturing step for a semiconductor device which is the second embodiment of the present invention.
Figure 19:
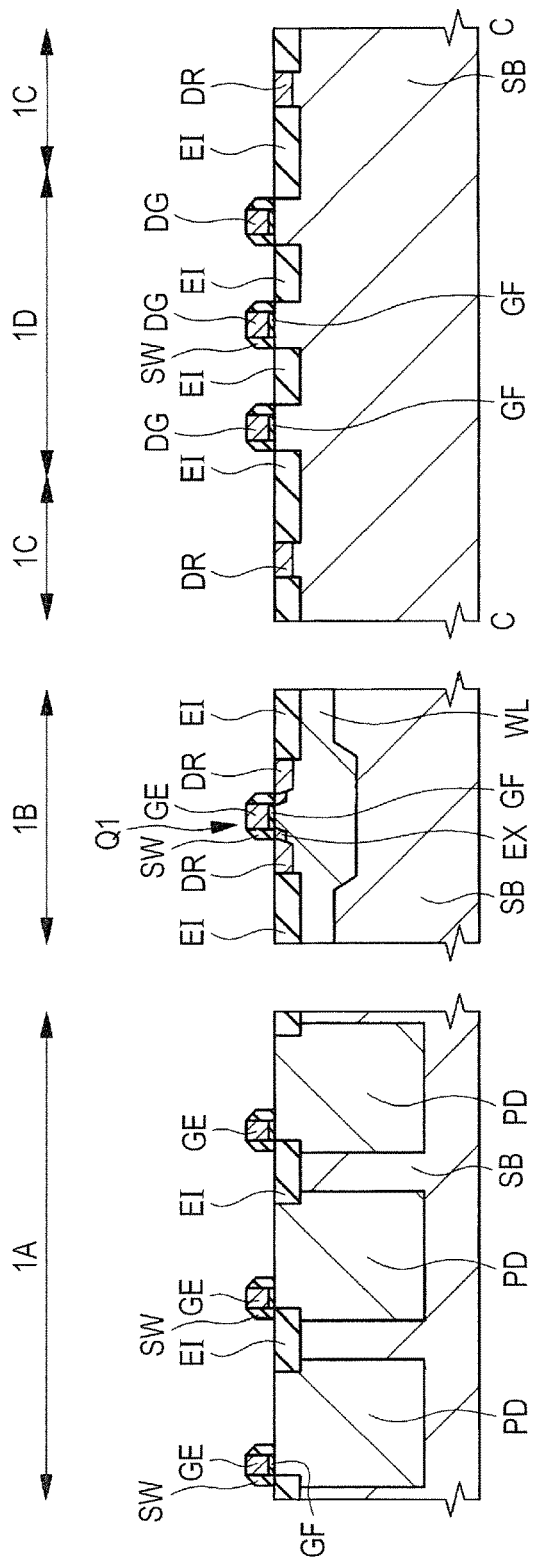
FIG. 19 is a cross-sectional view that includes a cross section taken along the line C-C of FIG. 18.
Figure 22:
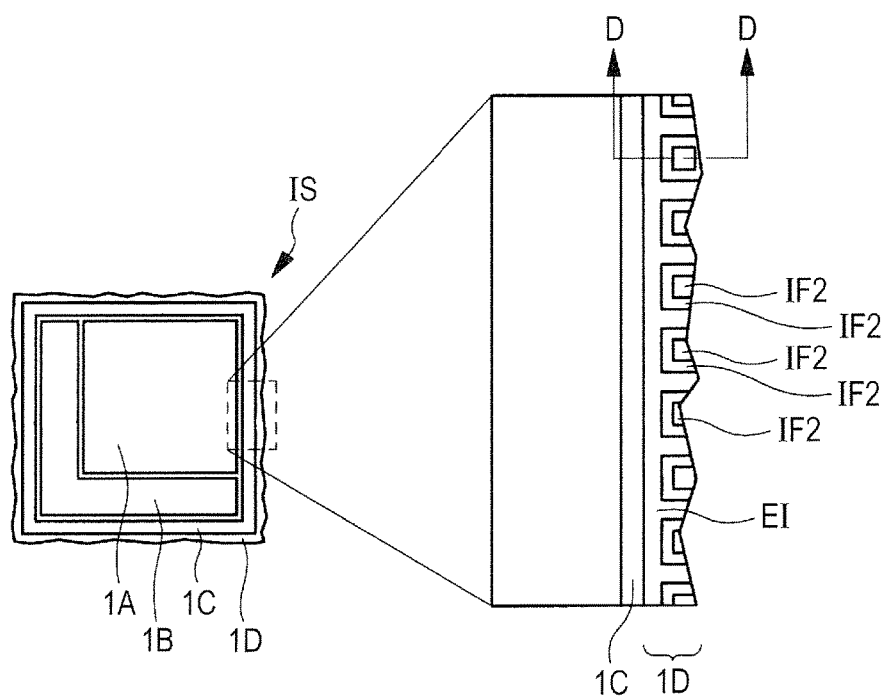
FIG. 22 is a cross-sectional view that explains a manufacturing step for the semiconductor device subsequent to FIG. 21.
Figure 23:
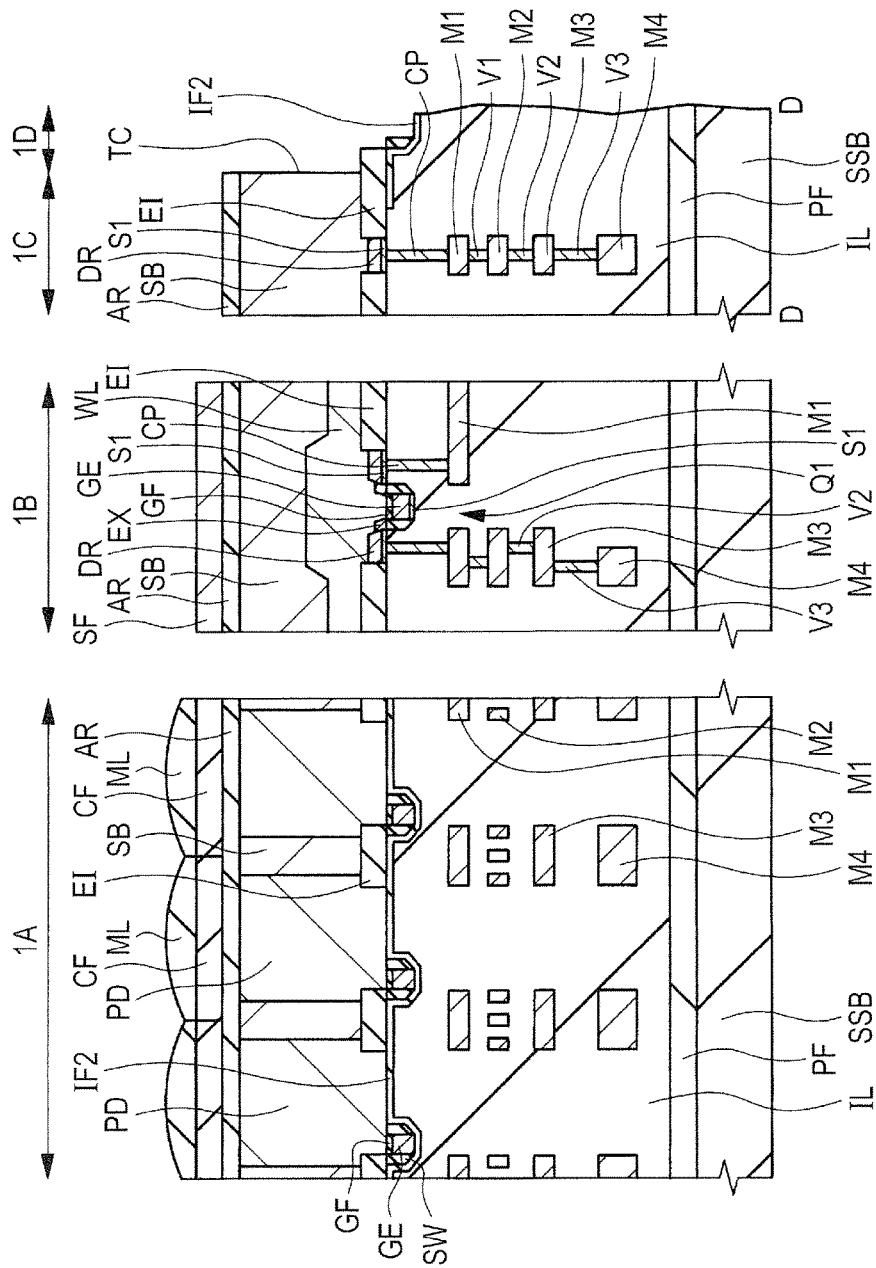
FIG. 23 is a cross-sectional view that includes a cross section taken along the line D-D of FIG. 22.

Below, a structure and a manufacturing step for a semiconductor device of the present second embodiment will be explained using FIG. 18 to FIG. 23. FIG. 19, FIG. 20, FIG. 21, and FIG. 23 are cross-sectional views that explain a manufacturing step for the semiconductor device of the present embodiment. FIG. 18 and FIG. 22 are plan views that explain a manufacturing step for the semiconductor device of the present embodiment. A cross-sectional view of the seal ring region 1C and the scribe region 1D shown in FIG. 19 shows a cross section taken along the line C-C of FIG. 18. Also, a cross-sectional view of the seal ring region 1C and the scribe region 1D shown in FIG. 23 shows a cross section taken along the line D-D of FIG. 22.

In the present embodiment, a dummy gate electrode is formed in an active region that is a dummy pattern in the scribe region.

In the manufacturing step for the semiconductor device of the present embodiment, first, steps similar to those explained using FIG. 1 to FIG. 4 are executed. Here, as shown in FIG. 2, in the scribe region 1D, patterns formed of the upper surface of the semiconductor substrate SB which are square dummy patterns are formed in an array shape.

Next, as shown in FIG. 18 and FIG. 19, steps similar to those explained using FIG. 5 and FIG. 6 are executed. In other words, after forming the gate insulation films GF and the gate electrodes GE, the side walls SW and the source-drain regions are formed, and thereby elements such as the transistors Q1 are formed.

However, here, the gate electrodes GE are formed over the semiconductor substrate SB of the pixel region 1A and the peripheral circuit region 1B through the gate insulation films GF, and dummy gate electrodes DG are formed over the upper surface of the semiconductor substrate SB exposed from the element separation regions EI in the scribe region 1D through the gate insulation films GF. In other words, the present embodiment differs from the first embodiment in terms that the gate insulation films GF and the dummy gate electrodes DG are formed in the scribe region 1D.

The gate insulation film GF and the dummy gate electrode DG of the scribe region 1D are formed by the forming step for the gate insulation film GF and the gate electrode GE of the pixel region 1A and the peripheral circuit region 1B. Therefore, the dummy gate electrode DG is formed of a polysilicon film for example similarly to the gate electrode GE. In plan view, the dummy gate electrodes DG of the scribe region 1D do not overlap with the element separation region EI. In other words, in plan view, the entire dummy gate DG overlaps with the main surface of the semiconductor substrate SB which is exposed from the element separation region EI.

The dummy gate electrode DG is a pseudo electrode that forms neither an element nor a circuit and is not electrically coupled with the wiring in the solid-state imaging element that is formed later. Here, the source-drain region is not formed in an active region of the scribe region 1D. Also, there is no harm that a part of the active region is exposed from the gate insulation film GF and the side wall SW at the side of the dummy gate electrode DG. Further, in the plan view shown in FIG. 18, illustration of the side wall is omitted.

The reason for forming the dummy gate electrode DG in the present embodiment is that a recess is formed in the upper surface of the interlayer insulation film that is formed over the main surface of the semiconductor substrate SB and dishing occurs in the scribe region 1D and regions in the vicinity of the scribe region 1D. In other words, because the scribe region 1D is not a region for forming a circuit, the scribe region 1D is a region where it is not essentially necessary to form a gate pattern. However, when there is a region where the gate pattern is hardly formed, when an interlayer insulation film is formed over the semiconductor substrate SB in a later step, a height difference occurs in the upper surface of the interlayer insulation film between a region where the gate pattern is formed densely and a region where the gate pattern is formed sparsely. In this case, even when the upper surface of the interlayer insulation film having been formed is polished, the upper surface of the interlayer insulation film is not flattened uniformly, and the height difference remains.

When dishing occurs thus, there is a risk that defective film formation occurs in forming a film over the interlayer insulation film in a later step. Also, there are risks of occurrence of a working defect caused by occurrence of defocusing in exposing the photoresist film, or the short circuit caused by a residual film in the polishing step, and so on. These problems occur in the seal ring region 1C and the like in the vicinity of the scribe region 1D for example. Therefore, in the present embodiment, even in a region such as the scribe region 1D where it is not necessary to form a gate pattern that forms a circuit, the dummy gate electrode DG is formed by plural numbers. Further, although it is not illustrated, in order to eliminate a density difference in the arrangement of the gate pattern, the dummy gate electrode DG is formed not only in the scribe region 1D but also in the pixel region 1A and the peripheral circuit region 1B.

Figure 20:
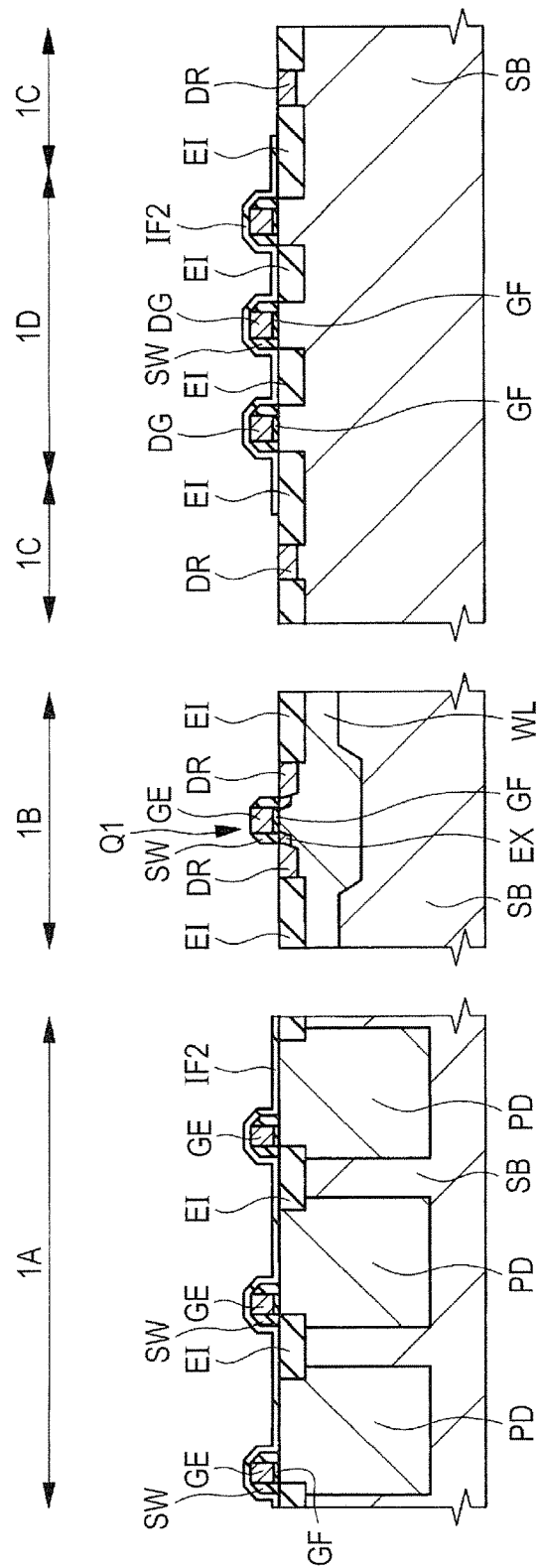
FIG. 20 is a cross-sectional view that explains a manufacturing step for the semiconductor device subsequent to FIG. 19.

Next, as shown in FIG. 20, a step slimier to that explained using FIG. 7 is executed. That is to say, the insulation film IF2 is formed which is a silicide protection film that covers a predetermined element and the like. The range where the insulation film IF2 is formed in plan view is similar to that of the first embodiment described above. Here, as a main feature of the present embodiment, the insulation film IF2 formed in the scribe region 1D covers the upper surface and the lateral wall of the dummy gate electrode DG. Also, in concrete terms, the lateral wall of the dummy gate electrode DG is covered with the insulation film IF2 through the side wall SW. The insulation film IF2 formed in the scribe region 1D is a film of a same layer as the insulation film IF2 formed in the pixel region 1A.

Figure 21:
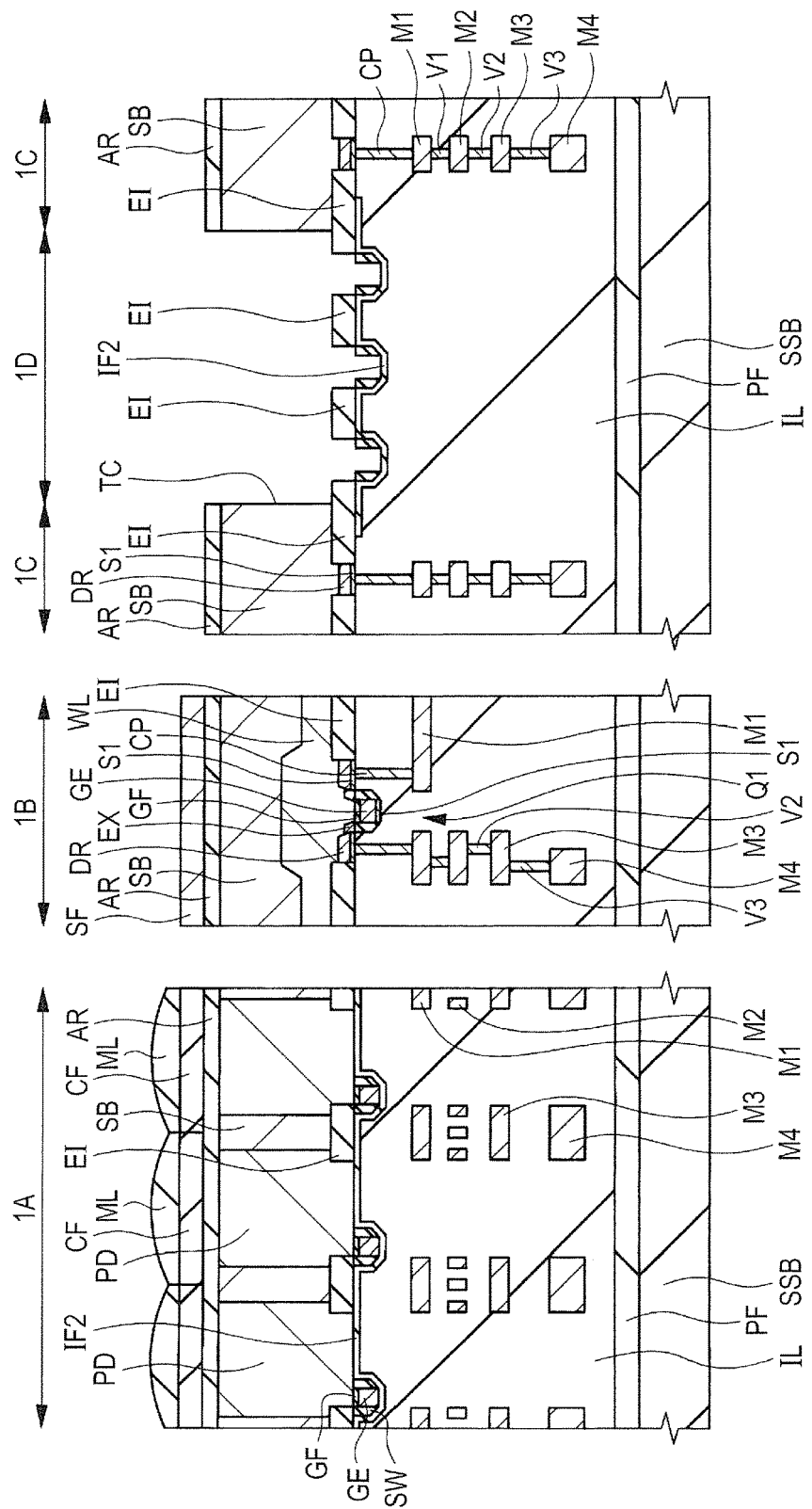
FIG. 21 is a cross-sectional view that explains a manufacturing step for the semiconductor device subsequent to FIG. 20.

Next, as shown in FIG. 21, steps slimier to those explained using FIG. 8 to FIG. 13 are executed. In other words, first, the silicide layer S1 is formed. Here, because the silicide layer S1 is formed in a state the semiconductor substrate SB and the dummy gate electrodes DG in the scribe region 1D are covered with the insulation film IF2, a silicide layer is not formed over the upper surface of each of the semiconductor substrate SB and the dummy gate electrodes DG.

Then, the laminated wire layer and the passivation film PF are formed, the support substrate SSB is joined to the passivation film PF, the semiconductor substrate SB is thereafter reversed, and the semiconductor substrate SB is made into a thin film. Thereafter, the anti-reflection film AR, the color filters CF, the microlenses ML, and the light shielding film SF are formed over the back surface of the semiconductor substrate SB. Next, the anti-reflection film AR and the semiconductor substrate SB of the scribe region 1D are removed using the photolithography technology and the dry etching method, and the trench TC is thereby formed.

Here, although dry etching that is executed for forming the trench TC is executed in a condition of high selectivity for a silicon oxide film, when dry etching is executed for long hours including over-etching so that a silicon layer of approximately 12 to 13 μm can be removed, the gate insulation film GF formed of a silicon oxide film having the film thickness of approximately 2 to 10 nm is removed. As a result, the dummy gate electrode DG that has been exposed by removal of the gate insulation film GF is removed by over-etching. Thereby, at the bottom of the trench TC, the upper surface of the element separation region EI, the upper surface of the side wall SW, and the upper surface of the insulation film IF2 that is formed lower than the side wall SW are exposed.

In other words, at the bottom of the trench TC, in regions sandwiched by the side walls SW, trenches are formed which are regions where the dummy gate electrodes DG are removed, and the upper surface of the insulation film IF2 is exposed to the bottom surface of the trenches. That is to say, the trenches are formed at the upper surface of the insulation film IF2 of the scribe region 1D, and at the bottom surface of the trenches, at a position lower than an interface where the element separation region EI and a part of the insulation film IF2 come into contact with each other, that is, at a position on the support substrate SSB side, the upper surface of other one part of the insulation film IF2 is exposed.

Also, the upper surface of the insulation film IF2 exposed at the bottom surface of the trenches sandwiched by the side walls SW mentioned here means the bottom surface of the insulation film IF2 that is formed right above the dummy gate electrode DG in the forming step for the insulation film IF2 explained using FIG. 20.

Next, as shown in FIG. 22 and FIG. 23, a dicing step is executed, and plural numbers of the solid-state imaging elements IS are obtained. Thus, the semiconductor device of the present embodiment is completed. Here, because only a part of the scribe region 1D is cut, other part of the scribe region 1D remains at the end section of the solid-state imaging element IS. As a result, at the upper surface of the end section the solid-state imaging element IS, in the scribe region 1D, the upper surface of the element separation region EI and one part of the upper surface of the insulation film IF2 that is adjacent to the element separation region EI in plan view are exposed.

Also, in a plan view shown in FIG. 22, illustration of the side wall is omitted. The upper surface of the insulation film IF2 exposed from the element separation region EI in the scribe region 1D includes the upper surface of the insulation film IF2 which exists at generally same height as the height of the interface of the element separation region EI and the insulation film IF2, and the upper surface of the insulation film IF2 which is the bottom surface of the trench formed at the upper surface.

In other words, at the upper surface of the end section of the solid-state imaging element IS, in the scribe region 1D, the upper surface of the side wall SW (refer to FIG. 23) inside the trench that is formed in the one part of the upper surface of the insulation film IF2, and other one part of the upper surface of the insulation film IF2 which is the bottom surface of the trench are exposed. The lateral wall of the trench formed at the upper surface of the insulation film IF2 of the scribe region 1D is covered with the side wall SW.

In FIG. 23, such structure is shown that the entire upper surface of the insulation film IF2 which is the surface being in contact with the element separation region EI in the scribe region 1D is covered with the element separation region EI and is not exposed at the bottom surface of the trench TC. In other words, between the neighboring element separation regions EI, only the surface of the side wall SW and the bottom surface of the trench formed at the upper surface of the insulation film IF2 are exposed. On the other hand, a part of the upper surface the insulation film IF2 which is a surface being in contact with the element separation region EI may be exposed at the bottom surface of the trench TC between the neighboring element separation regions EI. That is to say, the distance between the neighboring element separation regions EI may be larger than the width of the trench formed at the upper surface of the insulation film IF2.

In the present embodiment, the insulation film IF2 (refer to FIG. 20) that is made a film so as to cover the photodiode PD before forming the silicide layer is formed not only in the pixel region 1A but also in the scribe region 1D. Therefore, as shown in FIG. 21, the silicide layer S1 is not formed right above the photodiode PD, right above the semiconductor substrate SB of the scribe region 1D, and right above the dummy gate electrode DG.

The first embodiment described above is for preventing occurrence of the problem caused by contamination by the silicide layer and so on by covering the upper surface of the semiconductor substrate SB exposed in the scribe region 1D with the insulation film IF2 as shown in FIG. 7. On the other hand, when the dummy gate electrode DG is formed in the scribe region 1D as the present embodiment, it is necessary to also cover the upper surface of the dummy gate electrode DG with the insulation film IF2 as shown in FIG. 20.

The reason is that, as explained using FIG. 21, in the etching step for opening the semiconductor substrate SB, because the gate insulation film GF over the dummy gate electrode DG and the dummy gate electrode DG are removed by etching, when a silicide layer is formed between the dummy gate electrode DG and the interlayer insulation film IL, the silicide layer is exposed by the etching step. Therefore, in the present embodiment, by covering the upper surface of the dummy gate electrode DG by the insulation film IF2 as shown in FIG. 20, a silicide layer is prevented from being formed over the upper surface of the dummy gate electrode DG.

Thus, when the semiconductor substrate SB of the scribe region 1D is removed by etching as shown in FIG. 21, the silicide layer can be prevented from being etched in the scribe region 1D. Accordingly, because occurrence of contamination inside the etching device can be prevented, deterioration of the characteristics of the solid-state imaging element can be prevented. Also, when dicing is executed after the etching step, because a silicide layer is not formed in the scribe region 1D, the silicide layer can be prevented from being cut and scattered. Therefore, deterioration of characteristics of the solid-state imaging element caused by adhesion of a part of the silicide layer to the surface of the solid-state imaging element can be prevented.

Also, because such event can be prevented that a part of the silicide layer scatters and adheres to the electrode pad and the like, occurrence of the short circuit can be prevented, and occurrence of the junction defect of the bonding wire can be prevented.

First Modification

Figure 24:
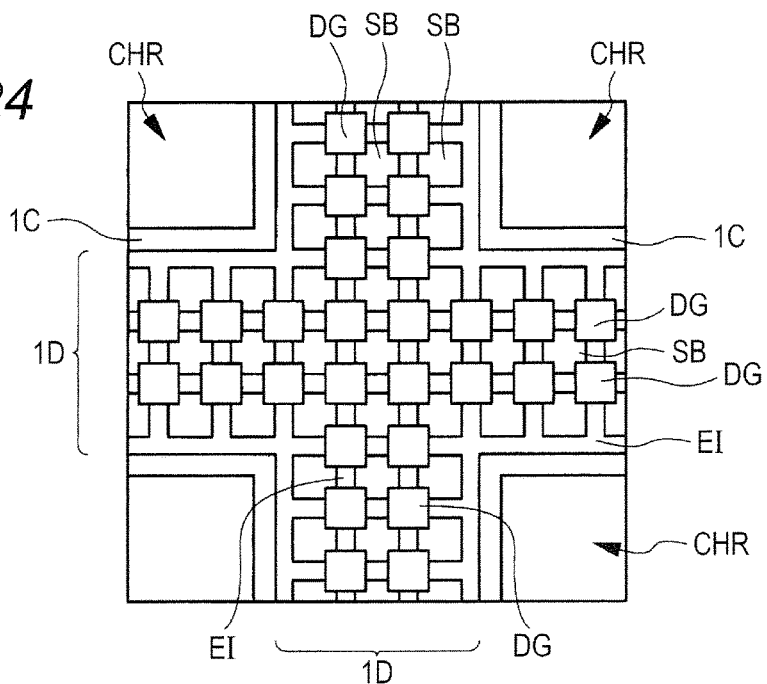
FIG. 24 is a plan view that explains the steps for manufacturing a semiconductor device which is the first modification of the second embodiment of the present invention.

In FIG. 24, a plan view that explains a step for manufacturing a semiconductor device that is the first modification of the present embodiment is shown. FIG. 24 is an enlarged plan view corresponding to FIG. 18.

As shown in FIG. 24, when the dummy gate electrodes DG are formed in the scribe region 1D, the dummy gate electrodes DG may overlap with not only the upper surface (dummy pattern) of the semiconductor substrate SB but also the element separation region EI in plan view. In this case, each dummy gate electrode DG overlaps with each of the element separation region EI and the upper surface (dummy pattern) of the semiconductor substrate SB that is adjacent to the element separation region EI in plan view.

Even if the corner section of the dummy gate electrode DG in plan view overlaps only with the corner section of the dummy pattern of the element separation region EI as the present modification, when the etching step explained using FIG. 21 is executed, the semiconductor substrate SB, the gate insulation film GF, and the dummy gate electrode DG of the region where the dummy pattern is formed are removed. In other words, the dummy gate electrode DG that does not overlap with the element separation region EI in plan view is removed.

Therefore, as explained using FIG. 18 to FIG. 23, by covering the dummy gate electrode DG by the insulation film IF2 that is the silicide protection film and preventing the silicide layer from being formed over the upper surface of the dummy gate electrode DG, the silicide layer can be prevented from scattering in the etching step and the dicing step. Thus, effects similar to those of the embodiment explained using FIG. 18 to FIG. 23 can be secured.

Also, when dry etching is executed as explained using FIG. 21, in the present modification, it is probable that a part of the dummy gate electrode DG overlapping with the element separation region EI in plan view, that is, a part of the dummy gate electrode DG right below the element separation region EI remains without being removed. When the dummy gate electrode DG is cut in the dicing step, silicon that forms the dummy gate electrode DG scatters and adheres to the electrode pad of the solid-state imaging element, and the short circuit or the junction defect of the bonding wire possible occurs.

Therefore, in the present modification, by executing dry etching using a fluoric acid (HF) for example after the dry etching, the dummy gate electrode DG that overlaps with the element separation region EI in plan view is removed. Thus, such event can be prevented that the short circuit or the junction defect of the bonding wire described above occurs due to cutting of the silicon layer in the dicing step.

Second Modification

Figure 25:
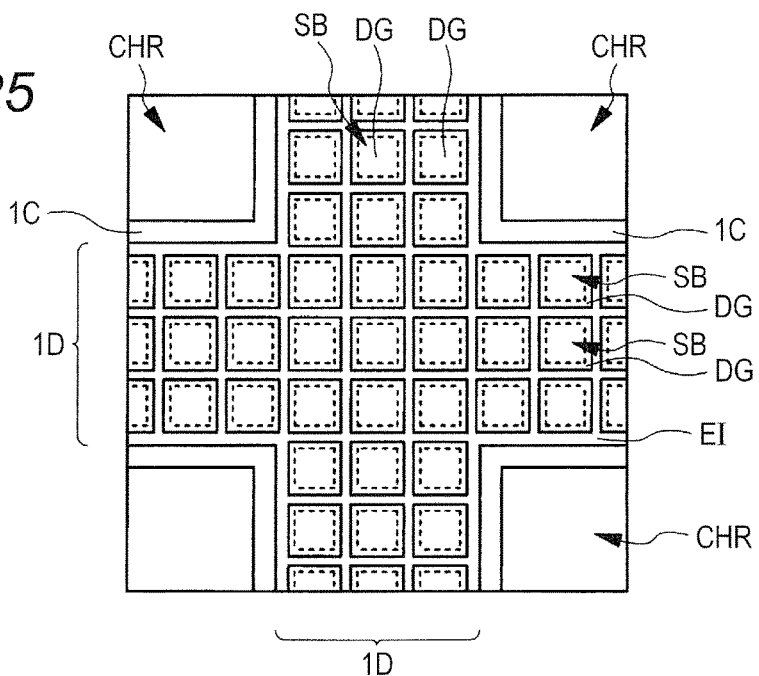
FIG. 25 is a plan view that explains a manufacturing step for a semiconductor device which is the second modification of the second embodiment of the present invention.
Figure 26:
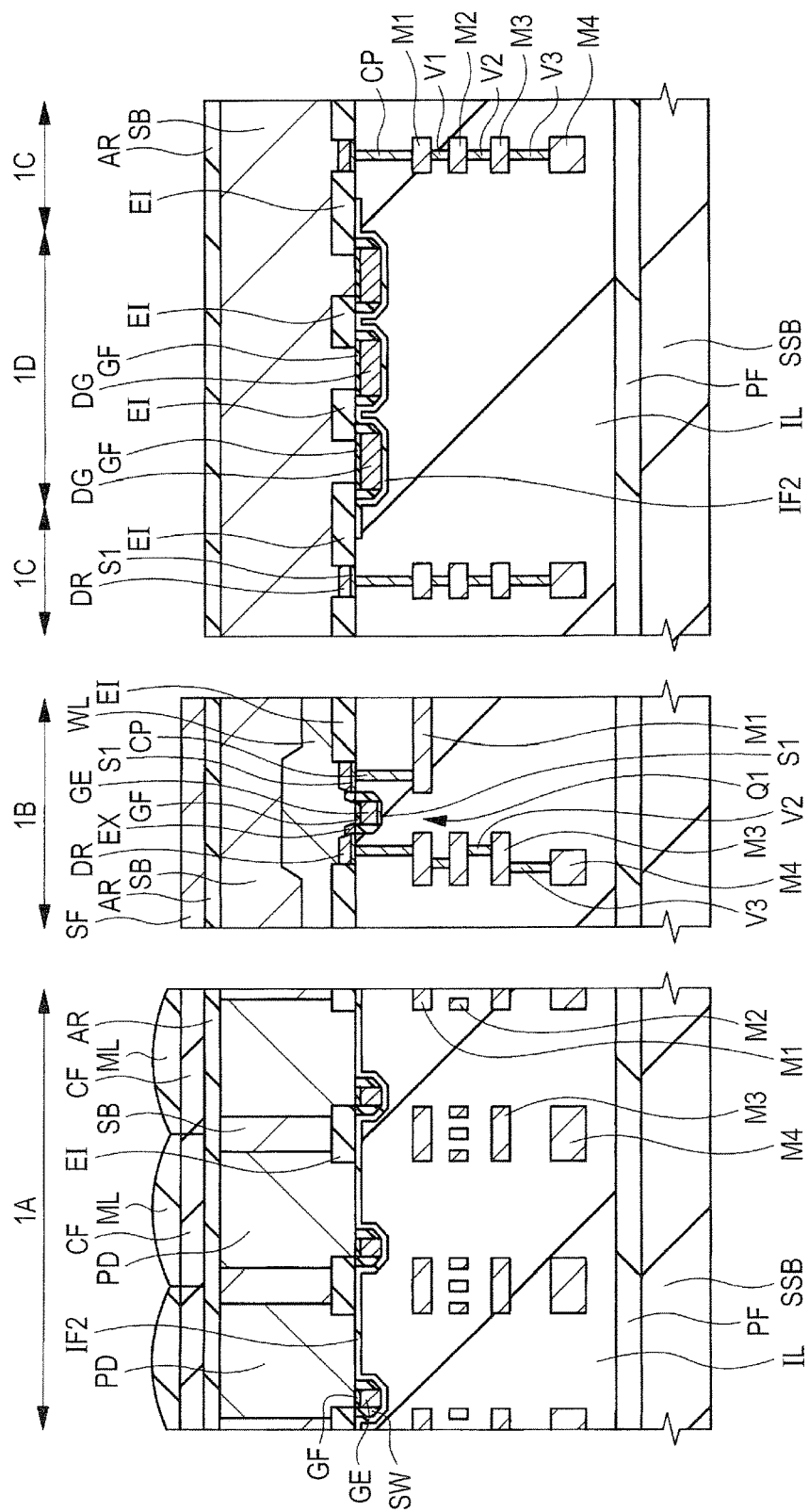
FIG. 26 is a cross-sectional view that explains a manufacturing step for the semiconductor device subsequent to FIG. 25.
Figure 27:
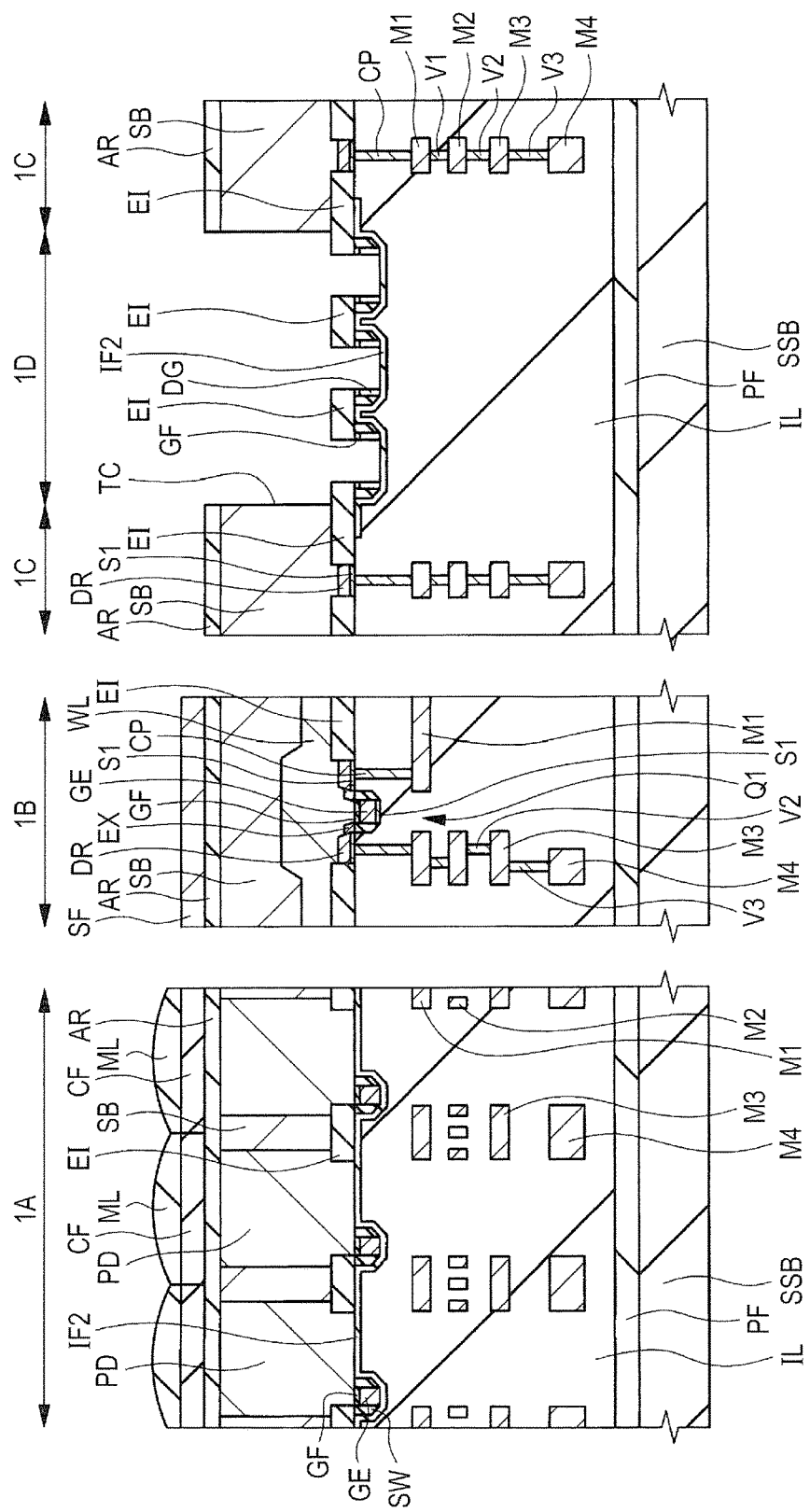
FIG. 27 is a cross-sectional view that explains a manufacturing step for the semiconductor device subsequent to FIG. 26.
Figure 28:
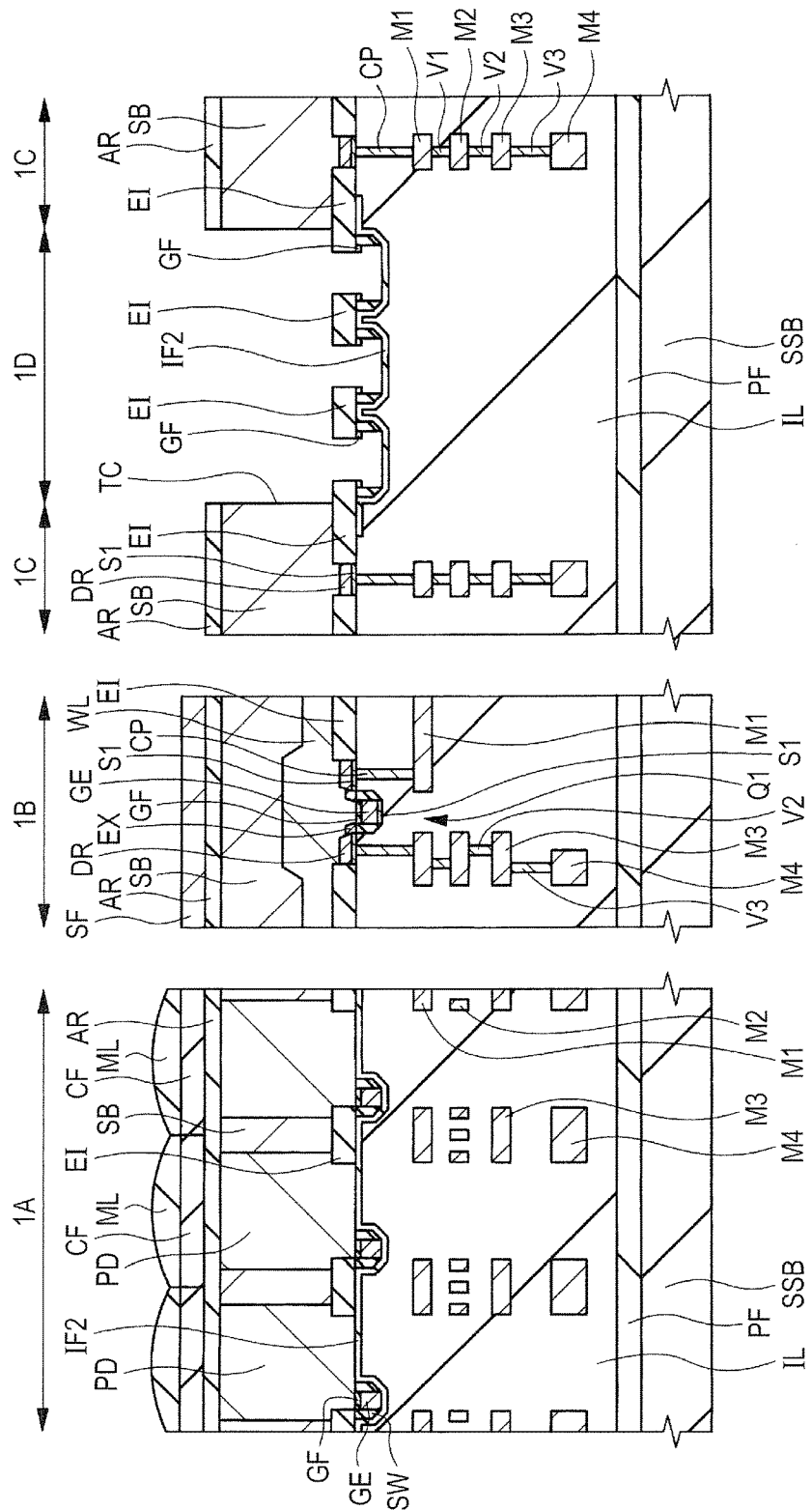
FIG. 28 is a cross-sectional view that explains a manufacturing step for the semiconductor device subsequent to FIG. 27.

Below, the manufacturing step for a semiconductor device that is the second modification of the present embodiment will be explained using FIG. 25 to FIG. 28. FIG. 25 is a plan view that explains the manufacturing step for the semiconductor device that is the second modification of the present embodiment. FIG. 26 to FIG. 28 are cross-sectional views that explain the manufacturing step for the semiconductor device that is the second modification of the present embodiment. FIG. 25 is an enlarged plan view corresponding to FIG. 18.

As shown in FIG. 25, when the dummy gate electrode DG is formed in the scribe region 1D, the dummy gate electrode DG may have a shape larger than the upper surface (dummy pattern) of the semiconductor substrate SB in plan view. In other words, in plan view, the entire dummy pattern may overlaps with a part of the dummy gate electrode DG. In FIG. 25, the contour of the dummy pattern that overlaps with the dummy gate electrode DG is shown by a broken line. That is to say, the broken line shown in FIG. 25 shows a boundary line of the upper surface of the semiconductor substrate SB and the upper surface of the element separation region EI in a region that is covered with the portion right below the dummy gate electrode DG.

A cross-sectional view of the time after executing the steps explained using FIG. 1 to FIG. 12 in the present modification is shown in FIG. 26. In other words, FIG. 26 is a cross-sectional view that shows the structure obtained after the semiconductor substrate SB is reversed after forming the wiring layer and thereafter forming the color filters CF, the microlenses ML, and the like. As shown in FIG. 26, in the scribe region 1D, the entirety of the pattern (dummy pattern) of the main surface of the semiconductor substrate SB which is exposed from the element separation region EI in the gap between the element separation regions EI is covered with the dummy gate electrodes DG that are formed below the semiconductor substrate SB. Also, the dummy gate electrodes DG cover not only the dummy pattern but also the bottom surface of the element separation regions EI that are adjacent to the dummy pattern.

Here, as explained using FIG. 18 to FIG. 23, because the dummy gate electrode DG is covered with the insulation film IF2 that is a silicide protection film and a silicide layer is prevented from being formed over the upper surface of the dummy gate electrode DG, the silicide layer can be prevented from scattering in the etching step and the dicing step thereafter which are executed later. Thus, effects similar to those of the embodiment explained using FIG. 18 to FIG. 23 can be secured.

Next, as shown in FIG. 27, a step similar to the etching step explained using FIG. 21 is executed. Thus, the semiconductor substrate SB and a part of the gate insulation film GF and the dummy gate electrode DG of the scribe region 1D are removed. It is considered that a part of the dummy gate electrode DG right below the element separation region EI remains without being removed because the etching step is executed by dry etching that is anisotropic etching. Also, in FIG. 27, in order to facilitate understanding of the drawing, hatching of each of the gate insulation film GF and the dummy gate electrode DG remaining at the position right below the element separation region EI of the scribe region 1D is omitted.

Next, as shown in FIG. 28, by executing wet etching using a fluoric acid (HF) for example, the dummy gate electrodes DG that overlap with the element separation regions EI, that is, the dummy gate electrodes DG right below the element separation regions EI are removed. In this case, the shape of the element separation regions EI of the scribe region 1D becomes a shape extended in an eaves shape. In other words, trenches are formed at the upper surface of the insulation film IF2 exposed from the semiconductor substrate SB in the scribe region 1D, and a part of the element separation regions EI extends in an eaves shape at the positions right above the trenches.

The bottom surface of the element separation regions EI extending in an eaves shape thus is covered with the gate insulation film GF, and the dummy gate electrode (polysilicon film, conductor film) GE is exposed. This is similar also at the time after the dicing step is executed later and the solid-state imaging element IS completed.

In the step thereafter, the dicing step is executed similar to the step explained using FIG. 14 and FIG. 15, and the semiconductor device of the present modification is thereby completed.

In the present modification, similarly to the first modification described above explained using FIG. 24, by executing wet etching after the semiconductor substrate SB of the scribe region 1D is removed by dry etching, the dummy gate electrodes DG right below the element separation regions EI are removed. Thus, such event can be prevented that the short circuit or the junction defect of the bonding wire occurs due to cutting of the silicon layer in the dicing step.

Although the invention achieved by the present inventors has been explained above specifically based on the embodiments, it is needless to mention that the present invention is not limited to the embodiments described above and various alterations are possible within a scope not deviating from the purposes thereof.

What is claimed is:

1. A method for manufacturing a semiconductor device that has a solid-state imaging element of a back side illumination type, comprising the steps of:
    (a) providing a semiconductor substrate that comprises a main surface and a back surface on the opposite side of the main surface;
    (b) forming an element separation region at a part of the main surface of a second region that surrounds a first region of the semiconductor substrate in plan view;
    (c) forming an insulation film that covers the main surface of the semiconductor substrate exposed from the element separation region in the second region;
    (d) after the step (c), forming a silicide layer that is in contact with the main surface of the semiconductor substrate of the first region;
    (e) after the step (d), forming a wiring layer over the main surface of the semiconductor substrate and joining a support substrate above the wiring layer;
    (f) after the step (e), exposing the insulation film by removing the semiconductor substrate of the second region; and
    (g) after the step (f), cutting the wiring layer and the support substrate of the second region, and thereby obtaining the solid-state imaging element that includes the semiconductor substrate of the first region.

2. The method for manufacturing a semiconductor device according to claim 1, further comprising the step of:
    (b1) before the step (c), forming a light receiving element over the main surface of the semiconductor substrate of the first region,
    wherein, in the step (c), the insulation film covering an upper surface of the light receiving element and the main surface of the semiconductor substrate is formed, the main surface of the semiconductor substrate being exposed from the element separation region in the second region.

3. The method for manufacturing a semiconductor device according to claim 1, further comprising the step of:
    (b2) before the step (c), forming a gate electrode over the main surface of the semiconductor substrate of each of the first region and the second region through a gate insulation film;
    wherein, in the step (c), an upper surface of the gate electrode of the first region is exposed and the insulation film is formed, the insulation film covering the main surface of the semiconductor substrate of the second region and an upper surface of the gate electrode of the second region, and
    wherein, in the step (f), the insulation film is exposed by removing the semiconductor substrate and the gate electrode of the second region.

4. The method for manufacturing a semiconductor device according to claim 3,
    wherein the entirety of the gate electrode of the second region formed in the step (b2) overlaps with the semiconductor substrate that is exposed from the element separation region in plan view.

5. The method for manufacturing a semiconductor device according to claim 3,
    wherein the gate electrode of the second region formed in the step (b2) overlaps with each of the element separation region and the semiconductor substrate that is exposed from the element separation region in plan view.

6. The method for manufacturing a semiconductor device according to claim 5,
    wherein, in the step (f), the insulation film is exposed by removing the semiconductor substrate of the second region and the gate electrodes that do not overlap with the element separation region of the second region in plan view, and
    wherein the method for manufacturing a semiconductor device further comprises the step of:
    (f1) after the step (f) and before the step (g), removing the gate electrode that overlaps with the element separation region of the second region in plan view by a wet etching method.

7. The method for manufacturing a semiconductor device according to claim 1,
    wherein, in the step (f), the semiconductor substrate of the second region is removed by executing anisotropic etching and the insulation film is exposed.

8. The method for manufacturing a semiconductor device according to claim 1,
    wherein the silicide layer contains cobalt or nickel.

9. The method for manufacturing a semiconductor device according to claim 1,
    wherein the main surface of the semiconductor substrate is surrounded in plan view by the element separation region that is formed in the second region in the step (b).

10. The method for manufacturing a semiconductor device according to claim 1,
    wherein, in the step (f), an opening that penetrates the semiconductor substrate of the first region is formed by removing a part of the semiconductor substrate of the first region and the semiconductor substrate of the second region, and
    wherein the method for manufacturing a semiconductor device further comprises the step of:
    (f2) after the step (f) and before the step (g), forming an electrode pad inside the opening or over the opening.

* * * * *